US007234642B2

(12) United States Patent
Forster

(10) Patent No.: US 7,234,642 B2
(45) Date of Patent: Jun. 26, 2007

(54) MEMORY DEVICE

(75) Inventor: Ian Forster, Chelmsford (GB)

(73) Assignee: Mineral Lassen LLC, Las Vegas, NV (US)

( * ) Notice: Subject to any disclaimer, the term of this patent is extended or adjusted under 35 U.S.C. 154(b) by 212 days.

(21) Appl. No.: 10/296,769

(22) PCT Filed: Jun. 15, 2001

(86) PCT No.: PCT/GB01/02677

§ 371 (c)(1),
(2), (4) Date: Sep. 23, 2003

(87) PCT Pub. No.: WO01/97162

PCT Pub. Date: Dec. 20, 2001

(65) Prior Publication Data

US 2004/0057272 A1   Mar. 25, 2004

(30) Foreign Application Priority Data

Jun. 16, 2000  (GB) .................................. 0014621.7

(51) Int. Cl.
*G06K 19/00* (2006.01)
(52) U.S. Cl. ..................................... 235/487; 235/492
(58) Field of Classification Search ................ 235/492, 235/487, 486, 493, 441; 713/600; 365/233, 365/194, 230; 327/148, 157
See application file for complete search history.

(56) References Cited

U.S. PATENT DOCUMENTS 2,931,922 A    4/1960   Tubinis 4,344,001 A    8/1982   Tsuchiya et al.
4,939,747 A *  7/1990   Adler .......................... 375/213
5,321,664 A *  6/1994   Akimoto ................ 365/230.03

(Continued)

FOREIGN PATENT DOCUMENTS

EP    0 318 648 A2    6/1989

(Continued)

OTHER PUBLICATIONS

Ikeda et al., "Two-dimensional miniature optical-scanning sensor with silicon micromachined scanning mirror", SPIE 3008, 111 (1997).*
Kiang et al., "Micromachined microscanners of optical scanning", SPIE 3008, 82 (1997).*

*Primary Examiner*—Thien M. Le
(74) *Attorney, Agent, or Firm*—Christensen O'Connor Johnson Kindness PLLC

(57) ABSTRACT

A memory device operable to receive an input signal and to generate a corresponding data bearing output signal in response. The device includes a series of circuit stages operable to be triggered by the input signal at a first stage of the series, thereby causing a sequential triggering of stages along the series to a last stage of the series to generate the output signal, the data represented in time durations taken for each stage in the series to trigger a subsequent stage in the series. Sequential triggering of the stages generates a data bearing output signal for output from the device. The device can be modified to repetitively output the data in response to the input signal. Moreover, the device can be adapted to provide a delay before repeating the data, thereby coping with contention when several of the devices are operating within range of one another.

55 Claims, 14 Drawing Sheets

U.S. PATENT DOCUMENTS

| | | | |
|---|---|---|---|
| 5,404,553 A * | 4/1995 | Komori et al. | 712/25 |
| 5,587,577 A * | 12/1996 | Schultz | 235/462.44 |
| 5,602,999 A * | 2/1997 | Hyatt | 711/1 |
| 6,256,746 B1 * | 7/2001 | Cheng | 713/600 |
| 6,292,507 B1 * | 9/2001 | Hardin et al. | 375/130 |
| 6,317,381 B1 * | 11/2001 | Gans et al. | 365/233 |
| RE38,482 E * | 3/2004 | Leung et al. | 375/357 |

FOREIGN PATENT DOCUMENTS

| | | |
|---|---|---|
| EP | 0 803 791 A1 | 10/1997 |
| GB | 2 285 557 A | 7/1995 |
| GB | 2 344 021 A | 5/2000 |
| JP | 58-121867 | 7/1983 |
| WO | WO 98/26370 A1 | 6/1998 |

* cited by examiner

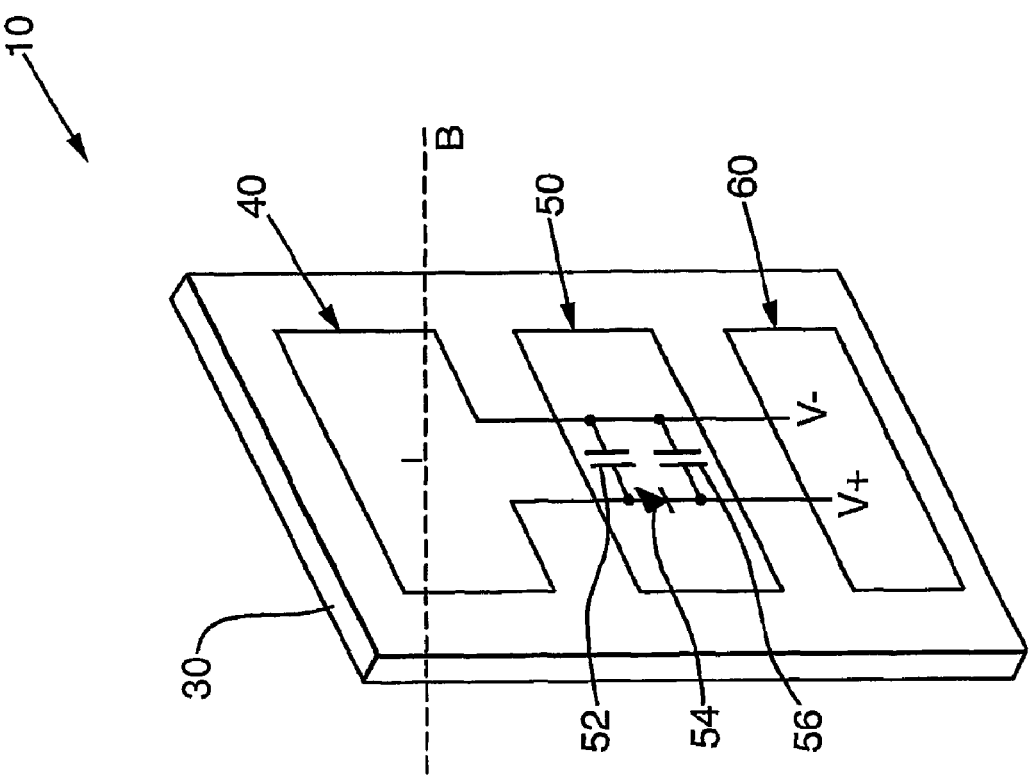
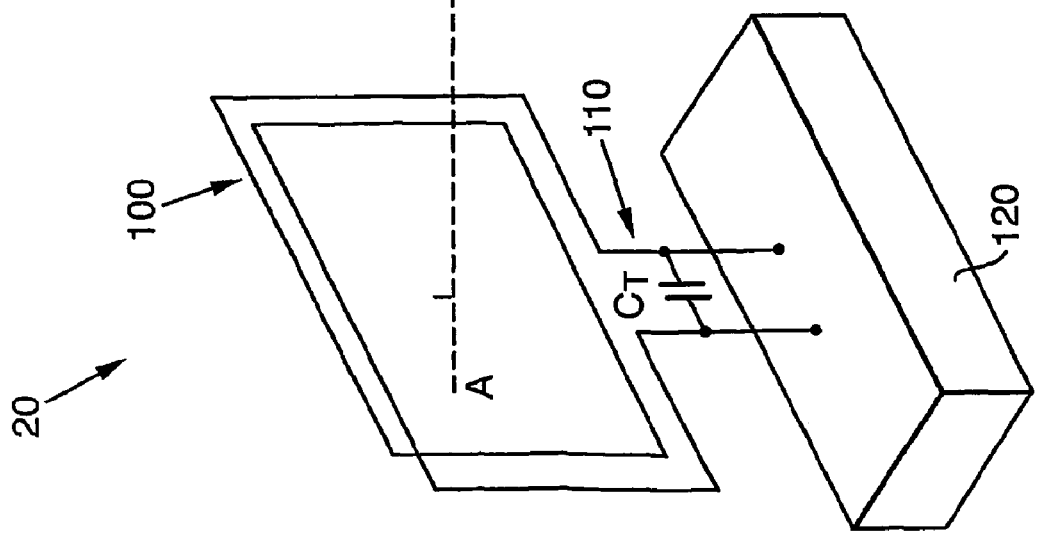
Fig.1.

MEMORY DEVICE

The present invention relates to a memory device operable to output information stored therein in response to being interrogated; in particular, but not exclusively, it relates to a memory device operable to output data stored therein in response to being remotely interrogated using electromagnetic radiation.

Conventional transponding devices susceptible to remote interrogation, for example transponder tags, can operate passively to reflect radiation incident thereupon or, alternatively, can operate actively to receive radiation and emit corresponding response radiation. It is known for active transponding devices to encode response radiation emitted therefrom with information stored in the devices, for example encoding the response radiation with one or more signature codes uniquely identifying each device.

Conventional active transponding devices suffer from a number of drawbacks, namely:

(a) they require an internal source of power to function, for example a miniature cell; and (b) they require relatively complex circuits when configured to respond with information such as a signature code unique thereto, for example by using dedicated microcontrollers and associated memory operable to store signature information.

The inventor has appreciated that it is feasible to fabricate a memory device capable of actively responding with a memorized signature code, namely with information stored therein, without needing to use complex components such as microcontrollers. The transponder device can thereby be made relatively inexpensive.

According to a first aspect of the invention, there is provided a memory device operable to receive an input signal and to generate a corresponding data bearing output signal in response, the device including a series of circuit stages operable to be triggered by the input signal at a first stage of the series thereby causing a sequential triggering of stages along the series to a last stage of the series to generate the output signal, the data represented in time durations taken for each stage in the series to trigger a subsequent stage in the series.

The invention provides the advantage that the series of stages is capable of bearing information and reading out the information in a sequential manner when triggered.

Advantageously, the stages are arranged such that each stage incorporates an input connected to a preceding stage in the series and an output connected to a successive stage in the series, each stage operable to exhibit an associated signal propagation delay therethrough from its input to its output, the propagation delays of the stages representing the data. Representing information in propagation delays of the stages provides the benefit that the propagation delays are manifest as durations between a series of current pulses when reading information from the stages.

Conveniently, each stage incorporates a resistor and a capacitor for determining its propagation delay. Use of the resistor and capacitor to determine the propagation delay provides a benefit that laser trimming can be applied to adjust their resistances and capacitances for programming data into the stages.

Preferably, each capacitor includes liquid crystal material as a dielectric for the capacitor, the material being optically modifiable for setting the propagation delay of its associated stage. Use of liquid crystal material enables capacitances of the capacitors to be adjusted by laser irradiation. If the material is bistatic, it becomes possible to reprogram the stages by further laser irradiation thereof In some applications of the device, it is desirable for the device to repeat information stored therein to allow an apparatus interrogating it more than one opportunity to receive information programmed into the device. Thus, advantageously, the series of stages includes a feedback path therearound linking the first stage to the last stage, the feedback path operable to cause the series to repetitively output its data during a period where the input signal is applied to the device.

A problem of contention can arise when several devices according to the first aspect of the invention are operated within range of an interrogating apparatus. It is thus desirable to interrupt output of data from each device to provide the apparatus with an opportunity of receiving information from individual devices without interference from the others. Thus, beneficially, the device incorporates controlling means for interrupting repetition of the data in response to the input signal received.

Preferably, each stage is operable to switch its respective output between binary states. Moreover, conveniently, each stage is operable to exhibit a Schmitt-trigger characteristic from its input to its output. Use of binary states and Schmitt-trigger characteristics enables the device to provide a more determinate output therefrom.

In order to support remote interrogation, the device advantageously further includes coupling means:

(a) for receiving input radiation and for generating the input signal in response; and (b) for receiving the output signal and emitting output radiation from the means in response.

The coupling means enables the device to be remotely interrogated. Remote interrogation makes the device useful for attachment to products or packages, for example for enabling information regarding the products or packages to be ascertained by interrogating the device.

The coupling means beneficially comprises a magnetically coupled loop antenna for receiving the input radiation and emitting the output radiation. Use of a loop antenna is convenient when the device is in the form of a planar card where the antenna is implemented as a looped conductive foil track printed or etched onto the card.

In order to circumvent a need for a local power supply in the device, for example a mercury button cell, the device advantageously includes converting means for converting a portion of the input signal into an electrical signal for powering and triggering the stages, the stages operable to present a variable load to the electrical signal, thereby modulating a portion of the input radiation reflected from the coupling means, the portion of the input radiation corresponding to the output radiation. The converting means enables the device to be powered from radiation received thereat. Conveniently, the converting means comprises rectifying means for rectifying part of the input radiation to generate a unipolar signal and charge storing means for filtering the unipolar signal to generate the electrical signal.

In order to enable the device to be conveniently fabricated using conventional microfabrication techniques, the stages of the device preferably incorporate FETs, the stages coupled together by sharing a single FET drain-source channel extending along the series.

Alternatively, when the device is used in environments where semiconductors would be unsuitable, for example at high temperatures in excess of 200° C. or where intense ionising radiation is experienced which would cause semiconductor devices to avalanche or latch-up, each stage advantageously incorporates a piezoelectric bimorph switching structure operable to deflect in response to a signal at the input of the stage and thereby generate a signal at the output of the stage for triggering a subsequent stage of the series.

The device according to the first aspect of the invention can be incorporated into portable transponder tags, for example personal identity tags which are personnel wearable.

According to a second aspect of the present invention, there is provided an apparatus operable to interrogate a device according to the first aspect of the invention and operable to receive sequentially output information stored therein.

According to a third aspect of the present invention, there is provided a method of outputting information stored in a device according to the first aspect, the method including the steps of:

(a) receiving an input signal at the device;
(b) applying the input signal to trigger the first stage in the series, thereby causing a sequential triggering of stages along the series from the first stage to the last stage in the series, the sequential triggering generating a corresponding output signal, the output signal conveying data represented in time durations taken for each stage in the series to trigger a subsequent stage in the series; and
(c) outputting the output signal.

Embodiments of the invention will now be described, by way of example only, with reference to the following drawings in which:

FIG. 1 is a schematic illustration of a first embodiment of a memory device according to the invention, the embodiment including an antenna, a rectification unit and a memory unit;

Figure 2:
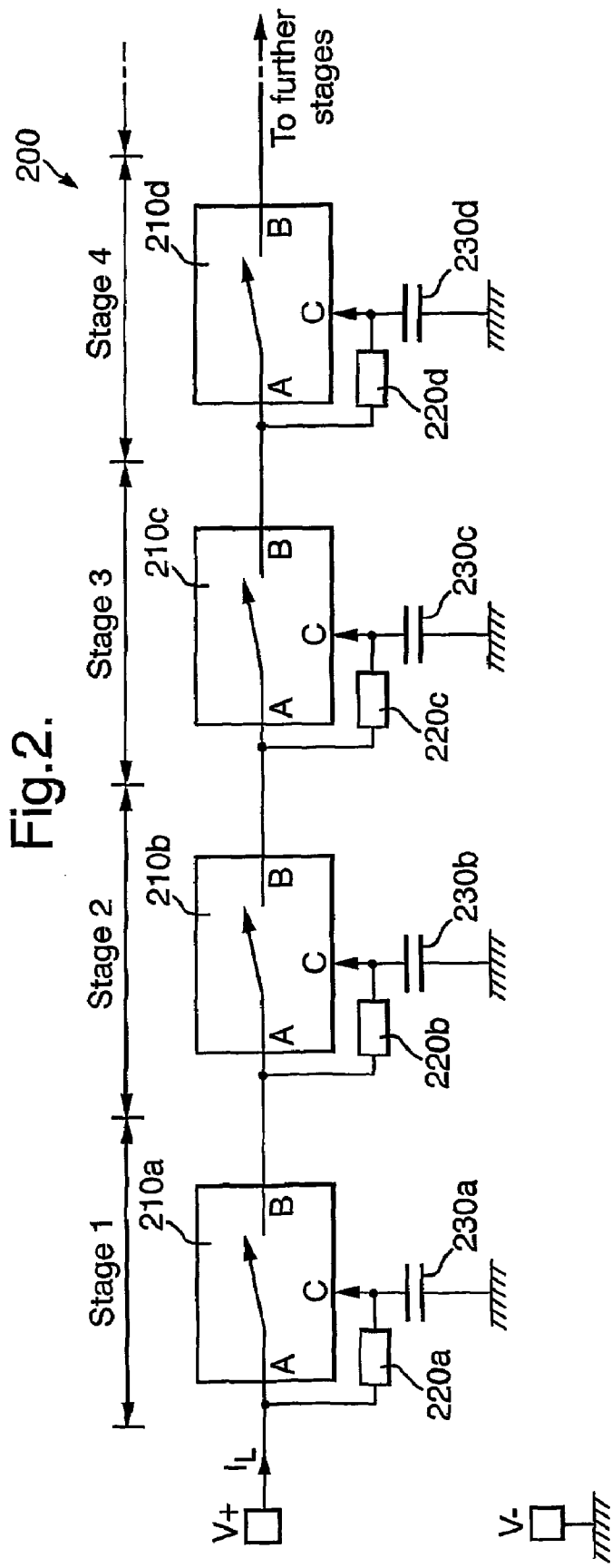
FIG. 2 is a schematic illustration of a first memory circuit for use in the memory device in FIG. 1.

Referring to FIG. 1, there is shown indicated by 10 a first embodiment of a memory device according to the invention together with an interrogation apparatus indicated by 20 operable to interrogate the device 10.

The device 10 comprises a substrate 30, for example a plastic card of physical dimensions similar to an ISO standard credit card having a length of 85 mm, a width of 54 mm and a thickness of 0.8 mm. The device 10 further incorporates a loop antenna indicated by 40 implemented in the form of a conductive metal foil track formed onto a major surface of the substrate 30. The antenna 40 is connected to a rectification unit indicated by 50, the unit 50 including a tuning capacitor 52, a high-frequency rectifier diode 54 and a storage capacitor 56; the unit 50 is accommodated into a first recess formed into the major surface. The capacitor 52 is arranged to resonate with an inductance provided by the antenna 40 at an operating frequency of the device 10, namely at a frequency $f_0$. The device 10 further comprises a memory unit indicated by 60 accommodated into a second recess formed into the major surface. On account of the units 50, 60 being accommodated in recesses formed into the substrate 30, the major surface of the substrate 30 is planar without components projecting outwardly therefrom.

The apparatus 20 comprises a loop antenna indicated by 100 connected to a tuning capacitor $C_T$ indicated by 110 and also to an electronic module 120 operable to drive the antenna 100. The capacitor $C_T$ is operable to resonate with an inductance provided by the antenna 100 at the frequency $f_0$.

Interactive operation of the apparatus 20 and the device 10 will now be described with reference to FIG. 1. The apparatus 20 and the device 10 are mutually aligned along an axis A–B so that the antennae 100, 40 are mutually electromagnetically coupled. The module 120 generates a signal at the frequency $f_0$ which it injects to the antenna 100 which emits corresponding electromagnetic radiation. The radiation is received at the antenna 40 to generate a received signal thereat. The received signal is rectified at the unit 50 to provide a direct current (d.c.) potential difference across the storage capacitor 56, the potential difference existing between a positive line V+ and a negative line V− provided to the memory unit 60. The memory unit 60 is triggered into operation by the potential difference and provides a time varying current load to the unit 50. This varying current load affects the amount of power transferred from the apparatus 20 to the device 10. The module 120 is operable to sense power flow therefrom to the device 10 and thereby sense the time varying current load.

The memory unit 60 is operable to provide the time varying load to the unit 50 according to data stored in the unit 60. Thus, the module 120 by way of the time varying load is capable of sensing the data stored in the unit 60.

The apparatus 20 and the device 10 can be used in a range of applications. For example, the device 10 can be affixed to packaging and interrogated by the apparatus 20, thereby providing for automatic identification of the packaging. Alternatively, the device 10 can be worn as an identity tag and the apparatus 20 can be used to control an access door, the device 10 therefore useable to enable authorised access only to regions accessible through the door.

The memory unit 60 will now be described in further detail with reference to FIG. 2. The memory unit 60 comprises a first circuit indicated by 200. The circuit 200 is connected to the positive line V+ and the negative line V− provided from the rectification unit 50. Moreover, the circuit 200 includes a cascaded series of stages of mutually identical configuration; only stages 1 to 4 are shown in the diagram although the circuit 200 includes further stages after stage 4. Each stage incorporates a switch 210, a timing resistor 220 and a timing capacitor 230. Each switch comprises three terminals A, B, C and is operable such that its terminals A and B are mutually isolated in a non-conducting state unless a potential at its terminal C is less than a threshold amount $V_T$ negative with respect to its terminal A in which case the terminals A and B are connected together to render the switch in a conducting state.

Each stage includes an input connected to its switch 210 terminal A and to a first end of its resistor 220. Each stage has an output which is connected to the terminal B of its switch 210. A second end of the resistor is connected to the terminal C of the switch 210 and to a first electrode of the capacitor 230. A second electrode of the capacitor 230 is connected to the line V−.

Stage 1 has its input connected to the line V+. For stage 2 and successive stages, each stage has its input connected to the output of its preceding stage in the cascaded series, and its output connected to its succeeding stage in the series.

Operation of the circuit 200 will now be described with reference to FIG. 2. Initially there is no potential difference between the lines V+ and V−. Radiation emitted from the apparatus 20 is received by the device 10 causing a potential difference to be generated from a time $T_1$ onwards across the lines V+ and V−; the potential difference is greater than the threshold amount $V_T$. Initially at the time $T_1$ and immediately therebefore, the capacitors 230 are in a discharged state thereby forcing the terminals C of the switches 210 to a potential of the line V− at the time $T_1$.

At the time $T_1$, stage 1 is not in a conducting state because its switch 210a terminal A is at a potential of the line V+ whereas its terminal C is at a potential of the line V−. The capacitor 230a from time $T_1$ onwards charges through the resistor 220a and eventually attains a potential of the amount $V_T$ negative with respect to the line V+ whereat the switch 210a switches to a conducting state thereby connecting stage 2 via stage 1 to the line V+.

When the line V+ is connected via stage 1 to stage 2 of the circuit 200, the terminal C of stage 2 switch 210b is at a potential of the line V− whereas the terminal A of the switch 210b is at a potential of the line V+ rendering the switch 210b in a non-conducting state. The capacitor 230b charges through the resistor 220b until a potential at the switch 210b terminal C is within the amount $V_T$ less than the switch 210b terminal A whereat the switch 210b switches to a conducting state thereby connecting stage 3 to the line V+ via stages 2 and 1. Subsequent stages in the sequence become sequentially connected through their preceding stages to the line V+ until all the stages in the series are connected to the line V+. As each stage of the series becomes connected via its preceding stages to the line V+, a current $I_L$ taken by the circuit 200 from the line V+ fluctuates in a exponentially decaying pulsed manner as the capacitors 230 of the stages become charged through their respective resistors 220 from the line V+.

The circuit 200 can be modified to incorporate in a range of two or more stages as required depending upon the complexity of information to be stored in the circuit 200. The resistors 220 and the capacitors 230 can have their values selected so that each stage has a mutually different propagation delay for switching from a non-conducting state to a conducting state; the propagation delays thereby capable of conveying information to the apparatus 20 which indirectly senses pulses in the current $I_L$.

Figure 3:
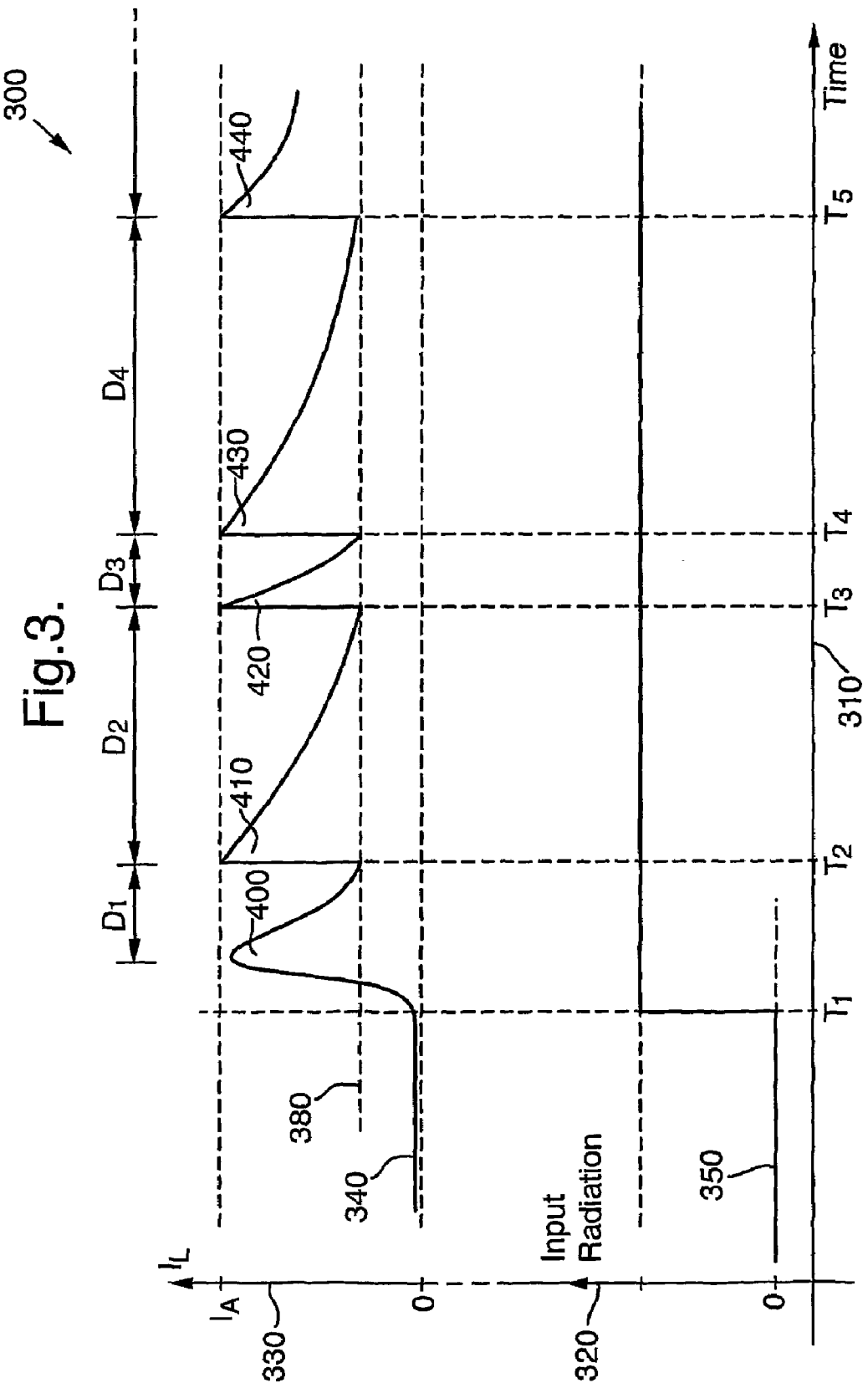
FIG. 3 is a graph of a current load presented by the circuit of FIG. 2 when triggered in the device of FIG. 1.

Referring now to FIG. 3, there is shown a graph indicated by 300 of a current load presented by the circuit 200 when triggered by the apparatus 20. The graph 300 includes a horizontal axis 310 indicating the passage of time from left to right, and two vertical axes 320, 330 corresponding to input radiation strength received at the antenna 40 and to the current $I_L$ absorbed by the circuit 200 respectively. Curves 340, 350 are associated with the axes 330, 320 respectively.

Prior to the time $T_1$, there is zero input radiation received at the device 10 from the apparatus 20; as a consequence, the circuit 200 does not demand current prior to the time $T_1$. At the time $T_1$, the apparatus 20 commences to emit radiation which is received at the antenna 40 at a power level $R_I$ as illustrated by the curve 350. The radiation is sustained after the time $T_1$.

At the time $T_1$ and shortly thereafter, the capacitor 56 charges up and results in a non-abrupt leading edge to a current peak 400 corresponding to current flowing through the resistor 220a charging the capacitor 230a The current peak 400 falls exponentially during a propagation delay $D_I$ through stage 1 until a potential across the capacitor 230a is within a difference of the amount $V_T$ from the line V+ potential at a time $T_2$.

At the time $T_2$, the switch 210a switches to a conducting state causing a second current peak 410 corresponding to the capacitor 230b charging through the resistor 220b. The current peak 410 decays exponentially during a propagation delay $D_2$ through stage 2 until a potential across the capacitor 230b is within a difference of the amount $V_T$ from the line V+ potential at a time $T_3$.

At the time $T_3$, the switch 210b switches to a conducting state causing a third current peak 420 corresponding to the capacitor 230c charging through the resistor 220c. The current peak 420 decays exponentially during a propagation delay $D_3$ through stage 3 until a potential across the capacitor 230d is within a difference of the amount $V_T$ from the line V+ potential at a time $T_4$.

At the time $T_4$, the switch 210c switches to a conducting state causing a fourth current peak 430 corresponding to the capacitor 230d charging through the resistor 220d. The current peak 430 decays exponentially during a propagation delay $D_4$ through stage 4 until a potential across a capacitor 230d of stage 5 (not shown) is within a difference of the amount $V_T$ from the line V+ potential at a time $T_5$.

A sequential triggering process continues to further stages of the circuit 200 in a similar manner as described for stages 2 to 4. By controlling the propagation delays $D_1$ to $D_4$ and those of further stages, information is conveyed in the current demand of the circuit 200 which is sensed at the apparatus 20 as information.

Durations of the delays $D_1$ to $D_4$ will be influenced by the intensity of the input radiation received at the antenna 40 after the time $T_1$. If the intensity of the input radiation is increased, the durations $D_1$ to $D_4$ will also increase because the potential difference between the lines V+, V− will be increased relative to the threshold amount $V_T$. Conversely, if the potential difference between the lines V+, V− is less than the amount $V_T$, the circuit 200 will not function correctly to read out data therefrom.

Figure 4:
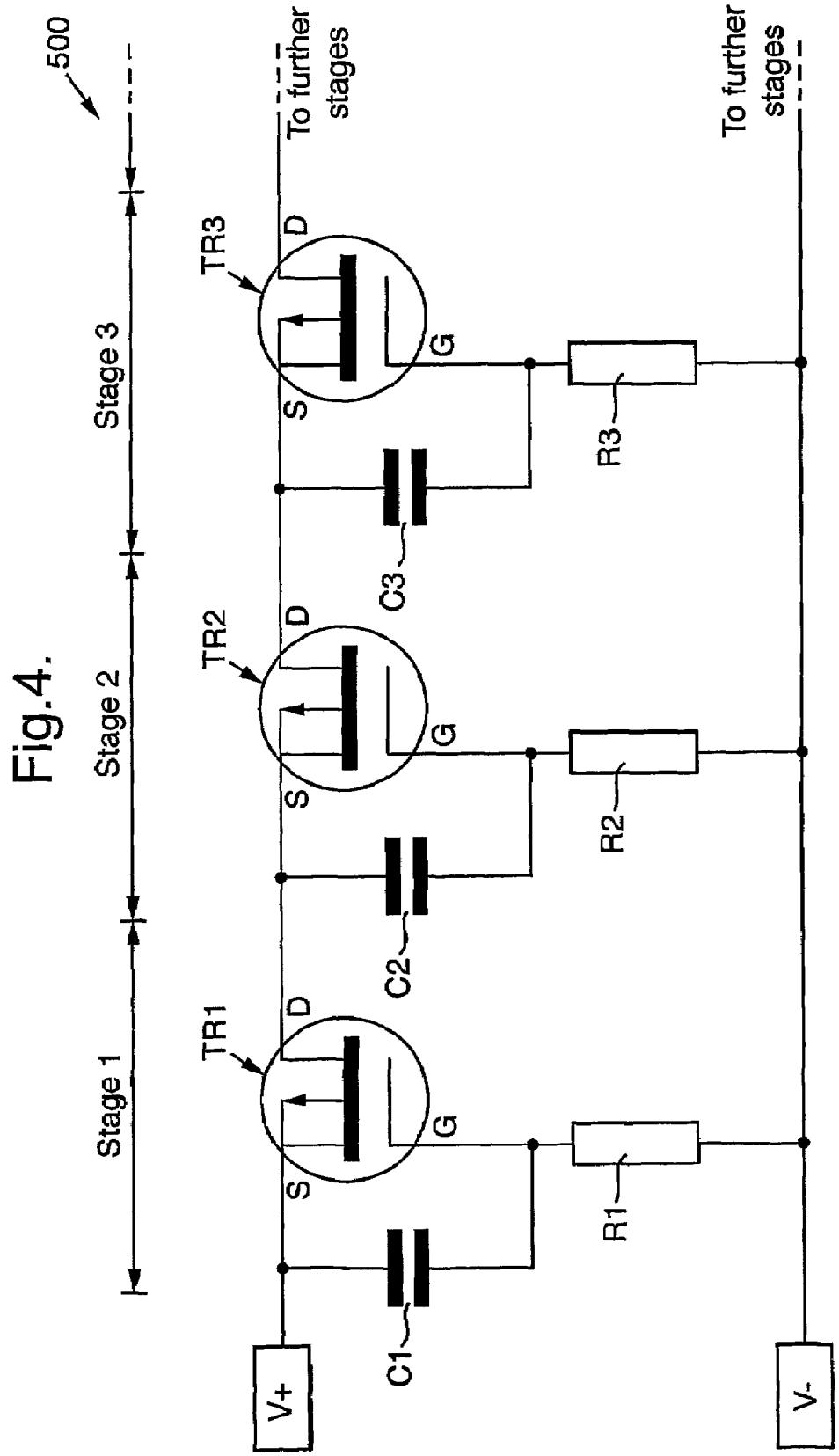
FIG. 4 is a schematic illustration of a second memory circuit for use in the memory device in FIG. 1.

Referring now to FIG. 4, there is shown a second circuit indicated by 500 for incorporation into the unit 60 in substitution for the circuit 200. The circuit 500 incorporates more than three stages although only stages 1 to 3 are shown. Each stage includes a p-channel metal-oxide semiconductor field effect transistor (MOSFET) TR together with a capacitor C and a resistor R, for example stage 1 includes a MOSFET TR1, a resistor $R_1$ and a capacitor $C_1$. Each stage has an input which is connected to a source electrode (S) of its MOSFET TR and to a first electrode of its capacitor C. A second electrode of the capacitor C is connected to a gate electrode (G) of the MOSFET TR and to a first electrode of the resistor R. A second electrode of the resistor R is connected to the line V−. Moreover, each stage has an output which is connected to a drain electrode (D) of its MOSFET TR.

The line V+ is connected to the input of stage 1. The output of stage 1 is connected to the input of stage 2. The output of stage 2 is connected to the input of stage 3, and so on.

The stages in the circuit 500 are identical except that the resistor R and capacitor C of each stage are selected to impart mutually different propagation delays for the stages, thereby recording information in the propagation delays of the stages.

Operation of the circuit 500 will now be described with reference to FIG. 4. Radiation is emitted from the apparatus 20 which is received at the device 10 and then rectified thereat to generate a potential difference between the lines V+, V− at a time $T_A$. The MOSFETS TR are at the time $T_A$ and immediately therebefore in a non-conducting state because their associated capacitors C are all discharged.

After the time $T_A$, the capacitor $C_1$ charges through its associated resistor $R_1$ until the gate electrode G of TR1 is more negative relative to the source electrode S of TR1 by an amount corresponding to a threshold voltage of TR1 whereat, at a time $T_B$, the MOSFET TR1 commences to conduct between its source (S) and drain (D) electrodes to connect stage 2 via stage 1 to the line V+.

The capacitor $C_2$ of stage 2 then commences to charge through its associated resistor $R_2$ until a potential across the capacitor $C_2$ exceeds an amount corresponding to a threshold voltage of TR2 whereat, at a time $T_C$, the MOSFET TR2 commences to conduct between its source (S) and drain (D) electrodes to connect stage 3 via stages 1 and 2 to the line V+.

The capacitor $C_3$ of stage 3 then commences to charge through its associated resistor $R_3$ until a potential across the capacitor $C_3$ exceeds an amount corresponding to a threshold voltage of TR3 whereat, at a time $T_D$, the MOSFET TR3 commences to conduct between its source (S) and drain (D) electrodes to connect stage 4 (not shown) via stages 1 to 3 to the line V+, and so on.

An exponentially decaying current pulse is extracted from the line V+ each time a successive stage of the circuit 500 is triggered by its preceding stage.

The circuit 500 has the advantage that it can be microfabricated and the resistors R and capacitors C trimmed by laser to encode data into the circuit 500 represented as the propagation delays of the stages of the circuit 500 which are manifest in time durations between current pulses extracted from the line V+.

Figure 5:
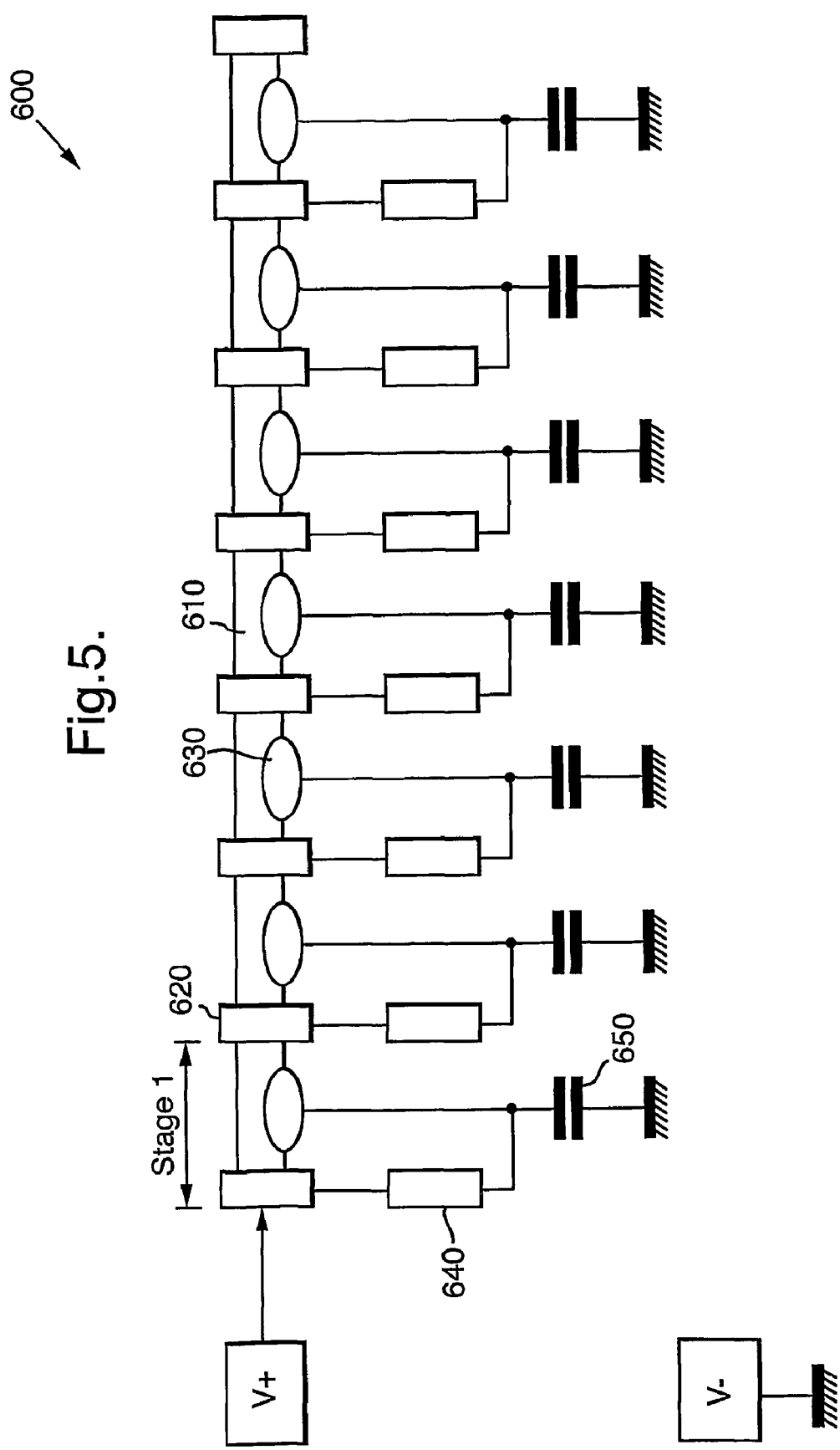
FIG. 5 is an illustration of a third memory circuit for the use in the memory device in FIG. 1, the third circuit incorporating a single FET channel spanning stages of the circuit.

When microfabricating the circuit 500, it is convenient to implement it in the form of a third circuit illustrated in FIG. 5 and indicated by 600. The MOSFETs of the circuit 500 are implemented with their channels fabricated as a continuous channel region 610 in FIG. 5. The source electrodes (S) in the circuit 500 are implemented in the third circuit 600 as connection regions, for example a region 620. The gates electrodes (G) in the circuit 500 are implemented as insulated gate electrodes, for example a gate electrode 630, along the continuous channel region 610. As in the circuit 500, each stage of the circuit 600 incorporates an associated resistor and capacitor for determining propagation delay therethrough, for example stage 1 in the circuit 600 includes an associated resistor 640 and an associated capacitor 650 for determining propagation delay therethrough. The resistors can be implemented as lightly doped polysilicon tracking and the capacitors can be incorporated as junction capacitances to a substrate of the third circuit 600 which is maintained at the line V− potential; the polysilicon tracks are thereby exposed and accessible to laser trimming for programming data into the third circuit 600.

The circuits 200, 500, 600 suffer the disadvantage that stages far along the series of these circuits remote from stage 1 are fed through numerous preceding stages. There arises thereby a maximum limit to the number of stages that can be incorporated into the circuits 200, 500, 600 because each stage has a voltage drop there across when in a conducting state, hence stages far along the series are subjected to less than the potential of the line V+ in operation. In order to address this maximum limit, an alternative fourth circuit is shown in FIG. 6 and indicated by 700, the circuit 700 capable of being incorporated into the unit 60 of the device 10.

Figure 6:
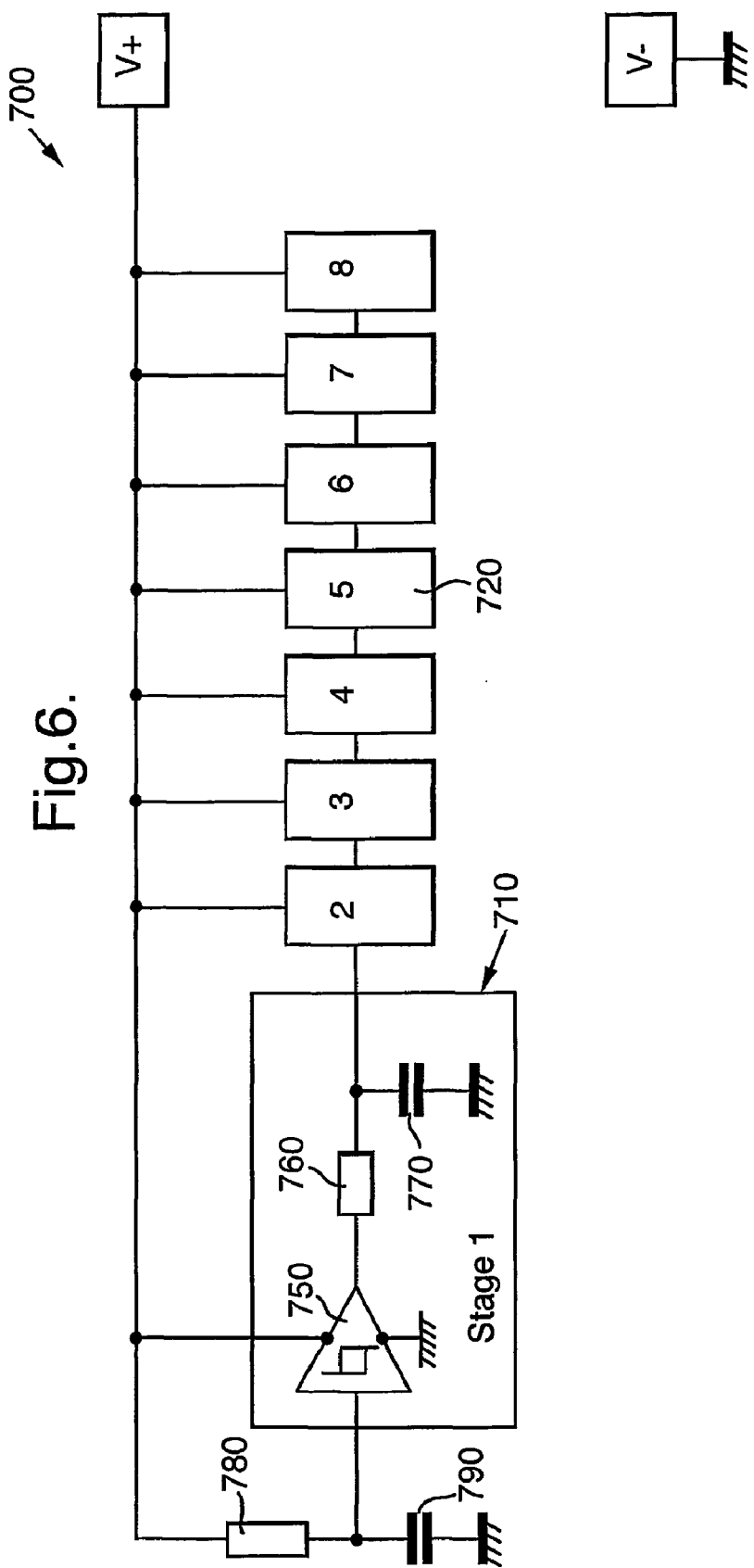
FIG. 6 is an illustration of a fourth memory circuit for use in the device in FIG. 1, the fourth circuit incorporating a Schmitt gate in each stage of the circuit.

In FIG. 6, the circuit 700 comprises eight stages 1 to 8 configured in series, for example a stage 1 and a stage 5 indicated by 710 and 720 respectively. The stages 1 to 8 are identical except that they are programmed to exhibit mutually different signal propagation delays therethrough. Stage 1 710 comprises a Schmitt gate 750, a resistor 760 and a capacitor 770. Stage 1 includes an input connected to an input of the gate 750. Moreover, stage 1 includes an output connected to a first electrode of the capacitor 770 and a first end of the resistor 760. A second end of the resistor 760 is connected to an output of the gate 750 and a second electrode of the capacitor 770 is connected to the line V−. The gate 750 also incorporates a positive supply terminal and a negative supply terminal which are connected to the lines V+, V− respectively.

The input of stage 1 710 is connected to a first end of a resistor 780 and to a first electrode of a capacitor 790. A second electrode of the capacitor 790 and a second end of the resistor 780 are connected to the lines V−, V+ respectively. The output of stage 1 is connected to an input of stage 2. An output of stage 2 is connected to an input of stage 3 and so on until stage 8 whose output is not connected to further stages.

The gates in the stages 1 to 8 are operable to provide a binary output substantially at potentials of the lines V−, V+ and also exhibit a hysteresis characteristic at their inputs, the characteristic known to one skilled in the art of logic circuit design.

Operation of the circuit 700 incorporated into the device 10 and interrogated by the apparatus 20 will now be described. Initially, the apparatus 20 is not emitting radiation; the capacitor 790 and the capacitors in the stages 1 to 8 are all discharged. At a time $T_a$, the apparatus 20 commences to emit radiation which is received by the device 10 and generates a received signal thereat which the unit 50 rectifies to provide a potential difference across the lines V−, V+.

After the time $T_a$, the capacitor 790 begins to charge through the resistor 780 from the line V+. When the potential across the electrodes of the capacitor 790 exceeds a hysteresis threshold of the gate 750, the output of the gate 750 switches from its initial binary state of substantially line V− potential to its other binary state of substantially line V+ potential. Change of output state of the gate 750 causes the capacitor 770 to charge through the resistor 760 from the output of the gate 750. When the potential across the capacitor 770 is sufficient to exceed a hysteresis threshold of a gate in stage 2, the gate in stage 2 switches its output from its initial binary state of substantially line V− potential to its other binary state of substantially line V+ potential. Thus, stage 2 charges its associated resistor and capacitor which, in turn, trigger stage 3 and so on to stage 8.

Each time a stage is triggered and switches its gate output from its initial binary state to its other binary state, an exponentially-decaying current pulse is extracted by the circuit 700 from the line V+; current pulses generated by the stages are sensed by the apparatus 20 which thereby receives information from the device 10 incorporating the circuit 700.

Because each stage derives its power directly from the line V+, succeeding stages are not powered through a plurality of preceding stages thereby enable, if required, the circuit 700 to incorporate a large number of stages, for example in excess of eight stages. The stages can be microfabricated onto a silicon integrated circuit implementing timing resistors of each stage, for example the resistor 760, as lightly doped polysilicon tracks which can be laser trimmed to program data into the circuit 700, for example an identification signature code.

In many practical situations, for example where sources of burst interference are present and interfere with operation of the apparatus 20, it is desirable that the circuit 700 is capable of repeating information programmed thereinto whilst radiation is emitted from the apparatus 20 and received by the device 10 incorporating the circuit 700. In order to achieve repetition of the information, the circuit 700 can be modified into a fifth memory circuit indicated by 800 in FIG. 7.

Figure 7:
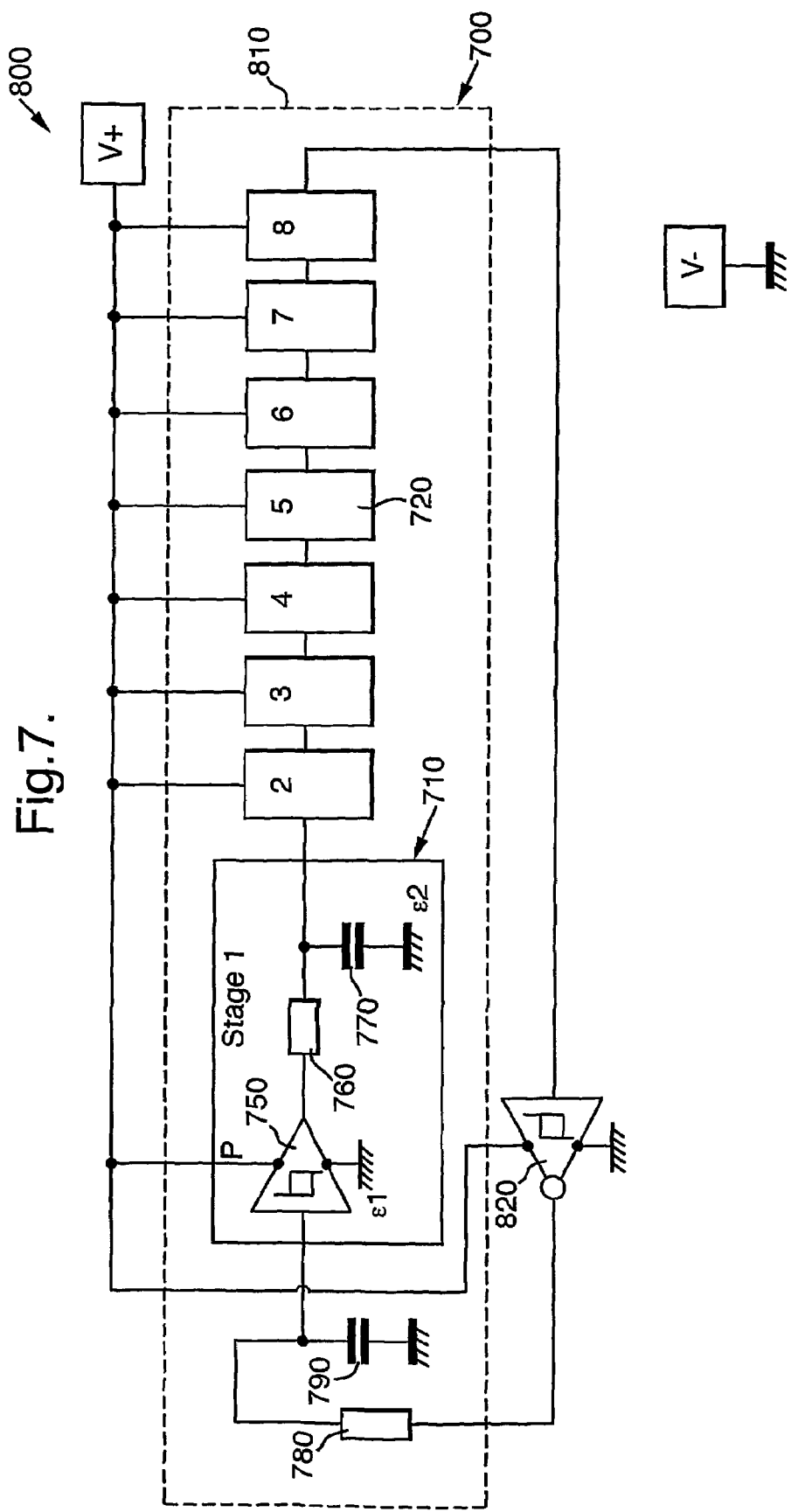
FIG. 7 is an illustration of a fifth memory circuit for use in the device in FIG. 1, the fifth circuit incorporating a Schmitt gate in each stage of the circuit and a feedback path to cause repetitive triggering of the stages.

In FIG. 7, the circuit 800 comprises the circuit 700 shown within a dotted line 810 together with an inverting Schmitt gate 820 whose input is connected to an output of stage 8 and whose output is connected to an end of the resistor 780 formerly connected to the line V+.

When a potential difference is applied between the lines V−, V+, the gate 820 sustains triggering within the circuit 800 so that exponentially-decaying current pulses are extracted continuously from the time V+ and are therefore continuously detectable at the apparatus 20.

In a situation where there are present the apparatus 20 and several devices each similar to the device 10, there arises a potential problem of contention where several of the devices are triggered simultaneously by the apparatus 20. In order to address such contention, the devices can be modified to assume a form as shown in FIGS. 8 and 9.

Figure 8:
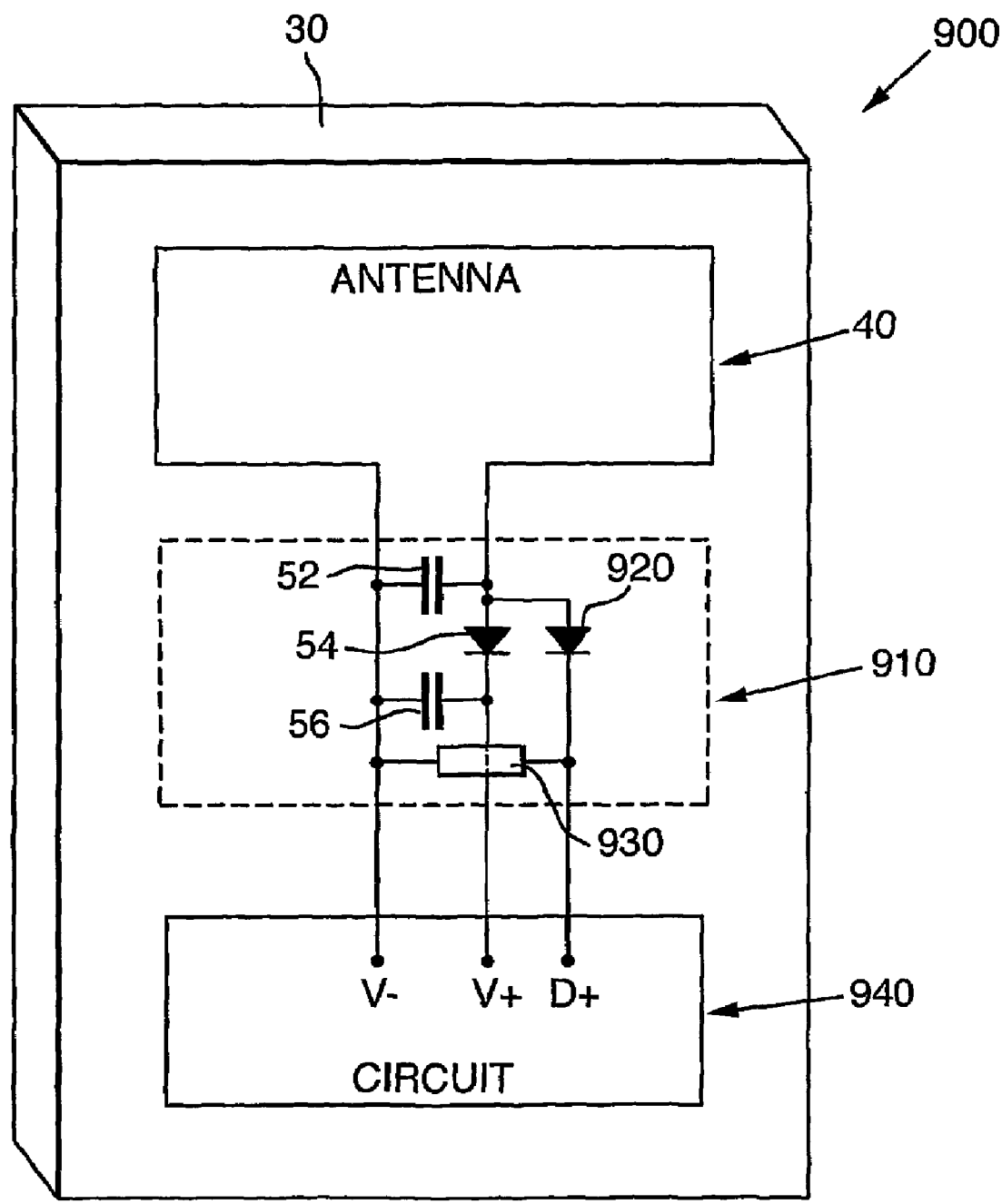
FIG. 8 is a schematic illustration of a second embodiment of a memory device according to the invention, the embodiment including an antenna, a rectification unit and a memory unit.
Figure 9:
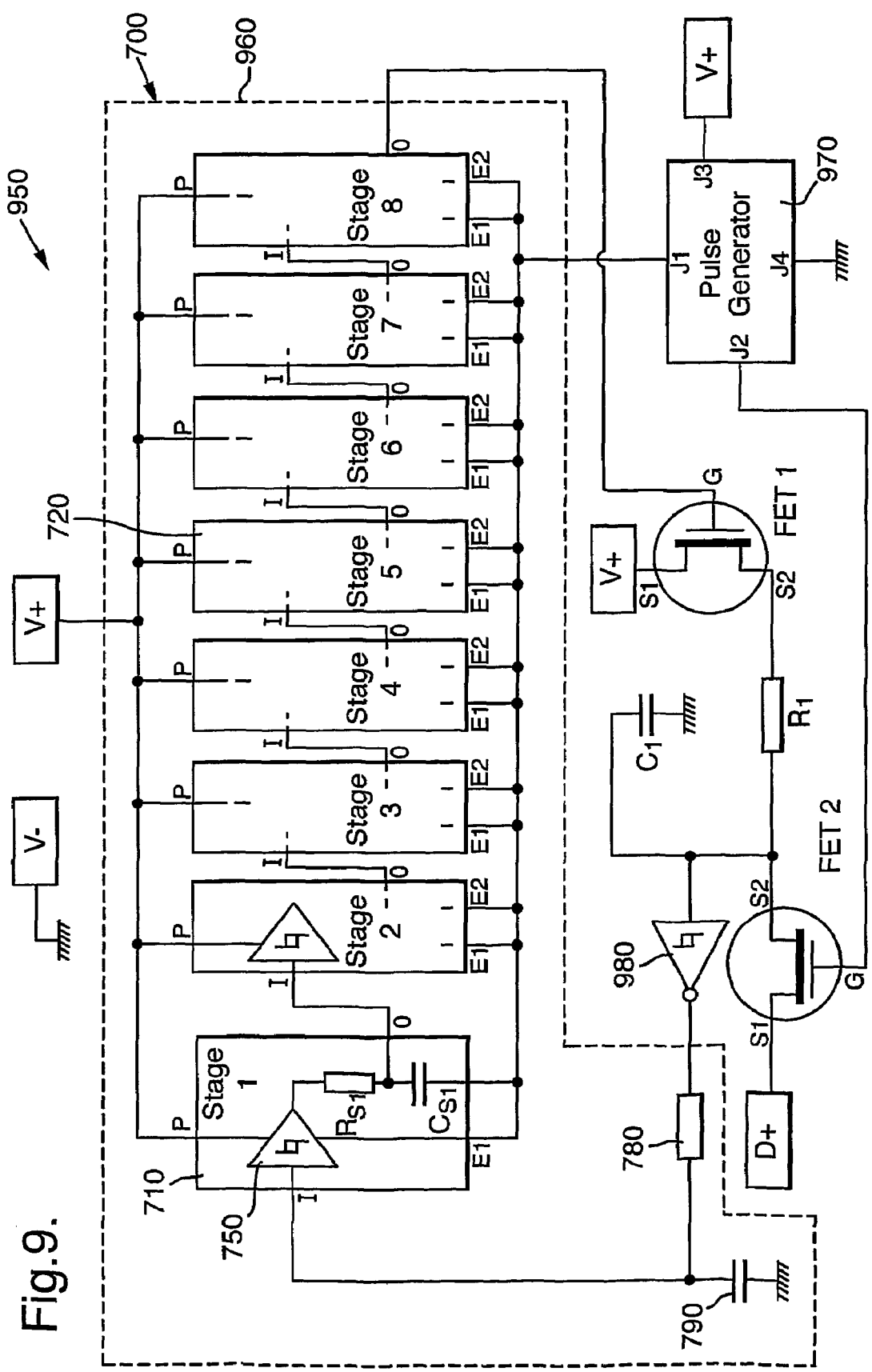
FIG. 9 is an illustration of a sixth memory circuit for use in the device in FIG. 8, the sixth circuit incorporating a Schmitt gate in each stage of the circuit, a feedback path to cause repetitive triggering of the stages, and further additional components to interrupt repetitive triggering of the stages to counteract contention.

In FIG. 8, there is shown a second embodiment of a memory device according to the invention indicated by 900. The device 900 incorporates the substrate 30 and the antenna 40 as included in the device 10. The device 900 further comprises a modified rectification unit and a memory unit indicated by 910 and 940 respectively. The rectification unit 910 comprises the capacitors 52, 56 and the diode 54 together with a second diode 920 and a load resistor 930. The capacitors 52, 56 and the diode 54 are connected in a similar manner as in the unit 50 to provide the two lines V−, V+ from the antenna 40. The diode 920 is connected at its anode to an anode of the diode 54. Moreover, a cathode of the diode 920 is connected to a line D+ and also to a first end of the resistor 930, a second end of the resistor 930 being connected to the line V−.

In the device 900, the lines V−, V+, D+ are connected to a memory unit 940 accommodated in a recess in the substrate 30 at an end of the substrate 30 remote from the antenna 40.

In operation, the unit 910 provides a d.c. potential difference across the lines V−, V+ when the device 900 is interrogated by the apparatus 20. Moreover, a pulsating unipolar signal is also provided at the D+ line with respect to the line V−.

The memory unit 940 incorporates a sixth memory circuit indicated by 950 and illustrated in FIG. 9. The circuit 950 comprises the circuit 700 included within a dotted line 960 together with an inverting Schmitt gate 980, a first and a second MOSFET (FET1, FET2), a resistor $R_1$ and a capacitor $C_{d1}$, and finally a pulse generator 970. Each of the MOSFETS comprises source and drain electrodes ($S_1$, $S_2$) and a gate electrode (G).

In the circuit 950, terminals of the circuit 700 ($E_1$, $E_2$) connected to the line V− in FIG. 7 are summed together and connected to a first terminal $J_1$ of the generator 970. The generator 970 is further connected at its third terminal $J_3$ to the line V+, and also at its fourth terminal $J_4$ to the line V−. Moreover, the generator 970 is connected at its second terminal to the gate electrode of MOSFET FET2. The FET2 is connected at its source electrode $S_1$ to the line D+.

The FET2 is connected at its drain electrode ($S_2$) to an input of the gate 980, to a first electrode of the capacitor $C_1$ and via the resistor $R_1$ to the drain electrode of the FET1. A second electrode of the capacitor $C_1$ is connected to the line V−. Moreover, the source electrode of the FET1 is connected to the line V+. An output from the gate 980 is connected to the resistor 780 at an end thereof remote from the capacitor 790. The gate electrode (G) of the FET1 is connected to the output from stage 8 of the circuit 700.

Operation of the circuit 950 incorporated into the device 900 interrogated by the apparatus 20 will now be described. When radiation is output from the apparatus 20, it is received at the antenna 40 of the device 900. The radiation causes a received signal to be generated at the antenna 40 which is processed by the rectification unit 910 to generate a potential difference across the lines V−, V+ and a pulsating unipolar signal at the line D+ at a frequency of the radiation received at the antenna 40. As soon as the potential difference is generated across the lines V−, V+, the circuit 950 becomes operational and the circuit 700 therein becomes triggered; the stages 1 to 8 are triggered in sequence until stage 8 is triggered and causes the gate electrode (G) of FET1 to be drawn substantially to a potential of the line V+. The FET1 thereby applies the potential of the line V+ to the resistor $R_1$ which charges the capacitor $C_1$.

However, charging of the capacitor $C_1$ is also influenced by charge injected or removed therefrom through the FET2 by periodic connection of the capacitor $C_1$ through the FET2 to the line D+. The FET2 is triggered periodically by the generator 970 which is triggered each time the circuit 700 extracts an exponentially decaying current pulse from the line V+. The signal at the line D+ is thus effectively sampled which has an effect of delaying re-triggering of the circuit 700 after stage 8 has triggered. Thus, current pulses extracted by the circuit 950 from the line V+ are in bursts punctuated by periods of inactivity. The periods of inactivity occur even when the apparatus 20 emits radiation continuously; the periods of inactivity are asynchronous with respect to other devices responsive to the apparatus 20, thereby providing the apparatus 20 with intervals of time when only one of the devices is responding to its emitted radiation. The intervals provide the apparatus 20 with a method of overcoming contention between a number of devices similar to the device 900 operating within interrogation range of the apparatus 20.

Referring back to FIG. 1 and 2, the device 10 with its circuit 200 can be alternatively implemented using mechanical switching components. Advantages of using mechanical switching components include:
(a) freedom of latch-up which can affect MOSFET—based circuits subjected to pulsed high intensity electric fields or ionising radiation, for example Roentgen-rays or Gamma rays;and
(b) an ability to operate at temperatures in excess of 200° C. where silicon bi-polar and MOSFET semiconductor components can suffer thermal run-away.

Figure 10:
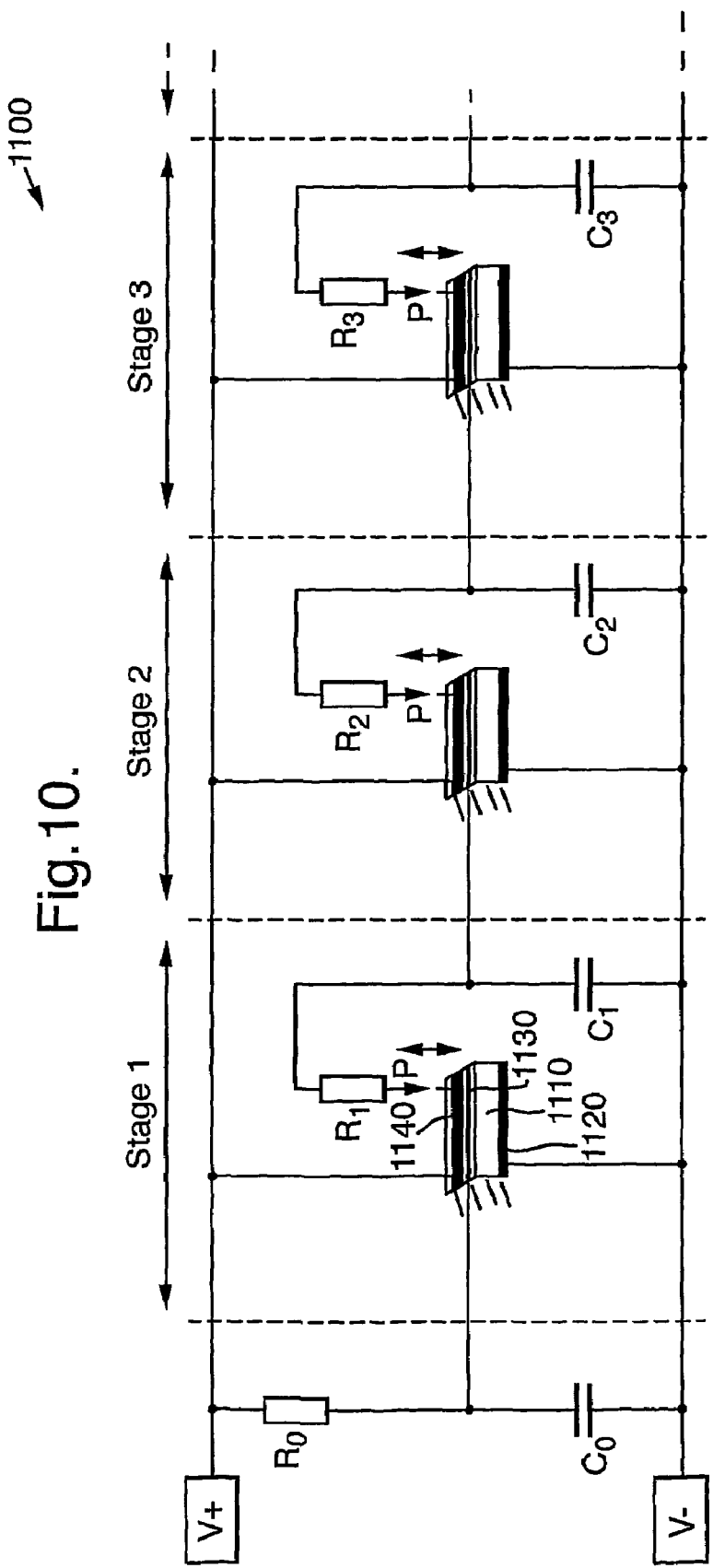
FIG. 10 is an illustration of a seventh memory circuit for use in the device in FIG. 1, the seventh circuit incorporating bimorph switching elements.

Referring now to FIG. 10, there is shown a seventh memory circuit according to the invention indicated by 1100. The circuit 1100 can be included in the device 10 by incorporating it into the memory unit 60 in substitution for the circuit 200.

The circuit 1100 includes a series of stages although only the first three stages (stage 1, stage 2, stage 3) of the series are illustrated in the diagram. Each stage includes an elongate piezo-electric bimorph element, a resistor and a capacitor, for example stage 1 includes a piezo-electric bimorph element 1110, aresistor $R_1$ and a capacitor $C_1$. Moreover, the circuit 1100 further includes a resistor $R_0$ and capacitor $C_0$ connected to an input of stage 1. Each bimorph element is anchored to a substrate at its first end and capable of flexing at its second end remote from the first end in response to an electric field generated transversely through a thickness of the element between its lower surface and its upper surface. Moreover, each bimorph element comprises a first upper metallized conductive track running along the length of the bimorph on its upper surface, for example a track 1140 of the element 1110 in stage 1, which is connected to the line V+. Furthermore, each bimorph element comprises a second upper metallized conductive track running along the length of the element on its upper surface, for example a track 1130 of the element 1110 in stage 1, connected to an input of the bimorph element's associated stage. Each element further includes a third metallized conductive track running along the length of its lower surface, the third track connected to the line V−; for example, the bimorph element 1110 of stage 1 includes a metallized track 1120 running along the length of its lower surface.

Each stage further comprises a contact point P operable to make electrical contact with the first track of the stage's bimorph element when the element flexes at its second end sufficiently in an upwards direction towards the point P. Such upward flexing occurs when the second track is driven to a positive potential relative to the third track which is at a potential of the line V−. In each stage, the point P is connected through the resistor of the stage, for example the resistor $R_1$ in stage 1, to a first electrode of the capacitor of the stage, for example the capacitor $C_1$ of stage 1, and to the output of the stage; a second electrode of the capacitor is connected to the line V−.

A first end of the resistor $R_0$ is connected to the line V+. Likewise a first electrode of the capacitor $C_0$ is connected to the line V−. A second end of the resistor $R_0$ is connected to a second electrode of the capacitor $C_0$ and also connected to the input of stage 1. The output of stage 1 is connected to the input of stage 2; the output of stage 2 is connected to the input of stage 3 and so on.

Operation of the circuit 1100 incorporated into the device 10 when interrogated by the apparatus 20 will now be described. Initially, the apparatus 20 is not emitting radiation, all the capacitors in the circuit 1100 are in a discharged state and the bimorph elements of the stages are in a undeflected state where they do not contact onto their respective contact points P. At a time $Q_1$, the apparatus 20 commences to emit radiation which is received at the antenna 40 of the device 10 and causes a received signal to be generated therein. The unit 50 converts the received signal into a potential difference between the lines V−, V+. The circuit 1100 becomes activated by the potential difference which causes the capacitor $C_0$ to charge through the resistor $R_0$ towards a potential of the line V+. As the capacitor $C_0$ charges, the bimorph element 1110 flexes upwardly towards its contact point P to eventually make contact therewith, thereby connecting the resistor $R_1$ to the line V+. The capacitor $C_1$ then commences to charge through the resistor $R_1$ towards a potential of the line V+ causing stage 2's bimorph element to flex upwardly and eventual make contact with its associated point contact P. Stage 2 then triggers stage 3 which in turn triggers stage 4 (not shown) and so on. Each time a bimorph element makes contact with its associated contact point P, an exponentially decaying pulse of current is extracted from the line V+. Such pulses are sensed by the apparatus 20, the apparatus 20 thereby receiving information from the device 10 programmed into the circuit 1100 corresponding to the propagation delays through the stages.

Each stage can be arranged to exhibit a mutually different propagation delay therethrough for recording data in the circuit 1100; the propagation delays can be varied by trimming the resistors in the stages or modifying the capacitors in the stages or both.

Figure 11:
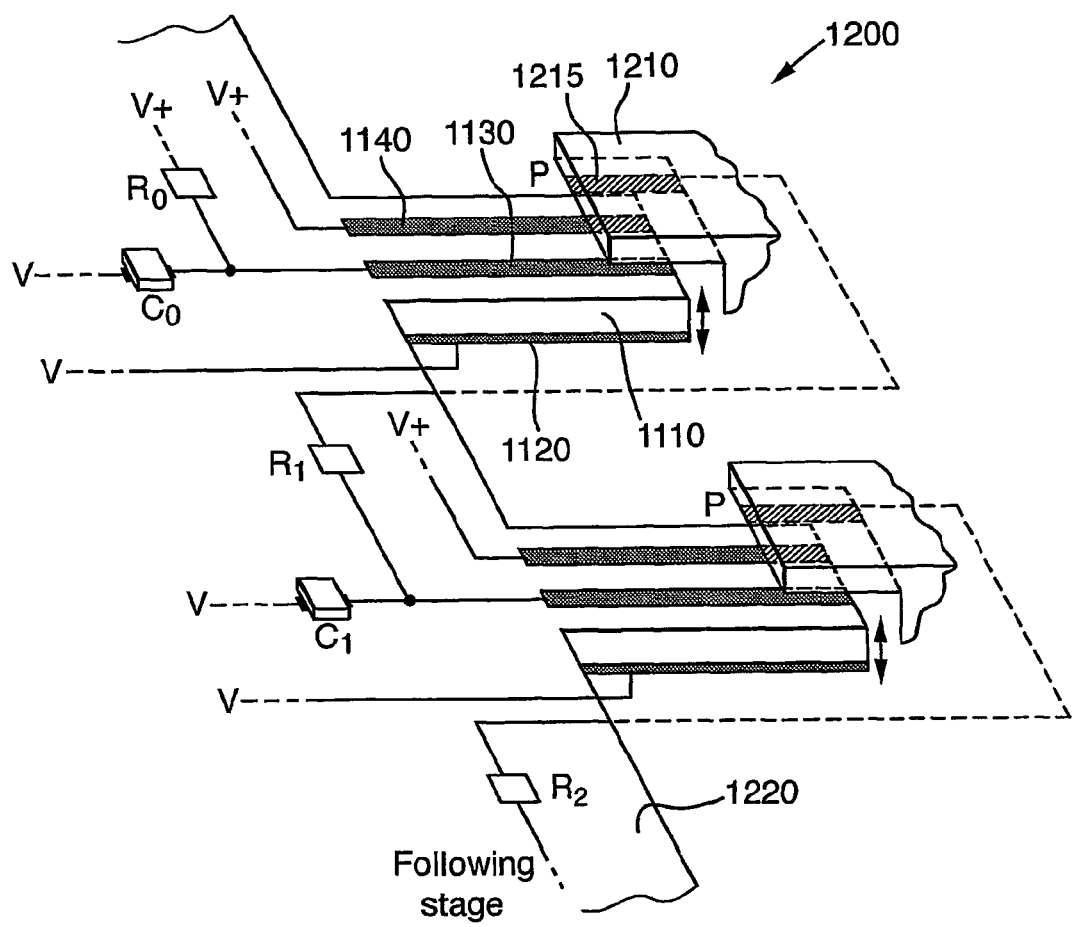
FIG. 11 is a schematic illustration of a spatial implementation of the bimorph elements in FIG. 10.

FIG. 11 illustrates a spatial implementation indicated by 1200 of the bimorph elements of stages 1 and 2 in the circuit 1100 shown in FIG. 10. The bimorph elements, for example the element 1110, are each anchored at one of their ends to a substrate 1220. Moreover, each contact point P is implemented as an overhanging region, for example a region 1210, including an associated contact track, for example a track 1215, operable to contact onto the first track of its associated bimorph element when it flexes sufficiently. The resistors $R_0$, $R_1$, $R_2$ and the capacitors $C_0$, $C_1$ are located in a region neighbouring to where the bimorph elements are anchored onto the substrate 1220.

Figure 12:
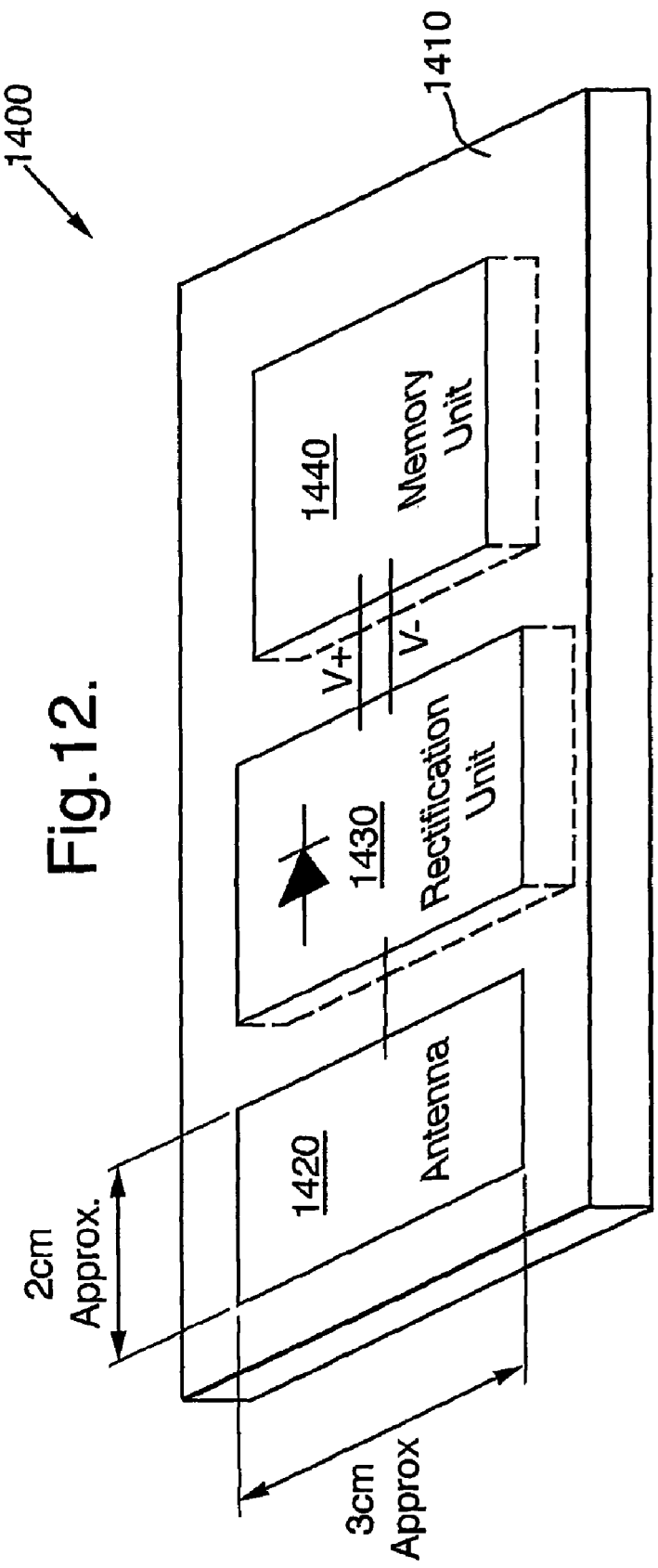
FIG. 12 is a schematic illustration of a third embodiment of a memory device according to the invention, the embodiment including a patch antenna for operating at a frequency in the order of 1 GHz.

Referring now back to FIG. 1, the device 10 includes the loop antenna 40 which is effective at receiving incoming radiation by radiation H-field coupling at frequencies lower than around 20 MHz. As radiation frequencies increase above 20 MHz, the antenna 40 will progressively respond to electric field components of incoming radiation. When the incoming radiation is at a much higher frequency than 20 MHz, for example in a frequency range of 868 MHz to 2.45 GHz, $\lambda/2$ patch antennae and folded dipole antennae become technically more appropriate. FIG. 12 is an illustration of a modified version of the device 10, the modified device indicated generally by 1400. The modified device comprises an insulating substrate 1410, a metallic film patch antenna 1420 formed onto the substrate 1410, and rectification and memory units 1430, 1440 respectively accommodated within recesses formed into the substrate 1410. The substrate 1410 is of a size similar to the aforementioned ISO standard credit card although it can assume other sizes if required. The modified device 1400, when operable to receive incoming radiation at a frequency of substantially 1 GHz, requires that that the patch antenna 1420 is in the order of 2 cm by 3 cm in size, although precise dimensions will depend upon the permittivity of the substrate 1410 material.

At relatively higher frequencies in the order of 1 GHz, loading effects by the modified device 1400 are less noticeable in comparison to the device 10 operable to receive and respond to interrogating radiation having a carrier frequency of $f_0=15$ MHz. As a consequence, interrogation equipment interrogating the modified device 1400 needs to be correspondingly more sensitive. In the modified device 1400, the antenna 1420 exhibits an output impedance to the rectification unit 1430 which is matched thereto. As a consequence, almost all of power conveyed in interrogating radiation received at the modified device 1400 is rectified in the rectification unit 1430 and supplied as power to the memory unit 1440, the units 1430, 1440 of the modified device 1400 being of similar design to the units 50, 60 respectively of the device 10. However, the rectification unit 1430 exhibits a radio-frequency load to the antenna 1420 which is a function of d.c. load presented by the memory device 1440 to the rectification unit 1430. Thus, as electrical load presented by the memory unit 1440 when triggered is a temporal function, the rectification unit 1430 responding thereto by correspondingly changing its input impedance. Such changes in impedance cause a measurable portion of the interrogating radiation received at the modified device 1400 to be reflected. Reflected radiation from the modified device 1400 is received by the interrogation equipment which detects encoded temporal fluctuations in the reflected radiation by measuring phase and amplitude of the reflected radiation with respect to the interrogating radiation, thereby detecting presence of the modified device 1400.

Figure 13:
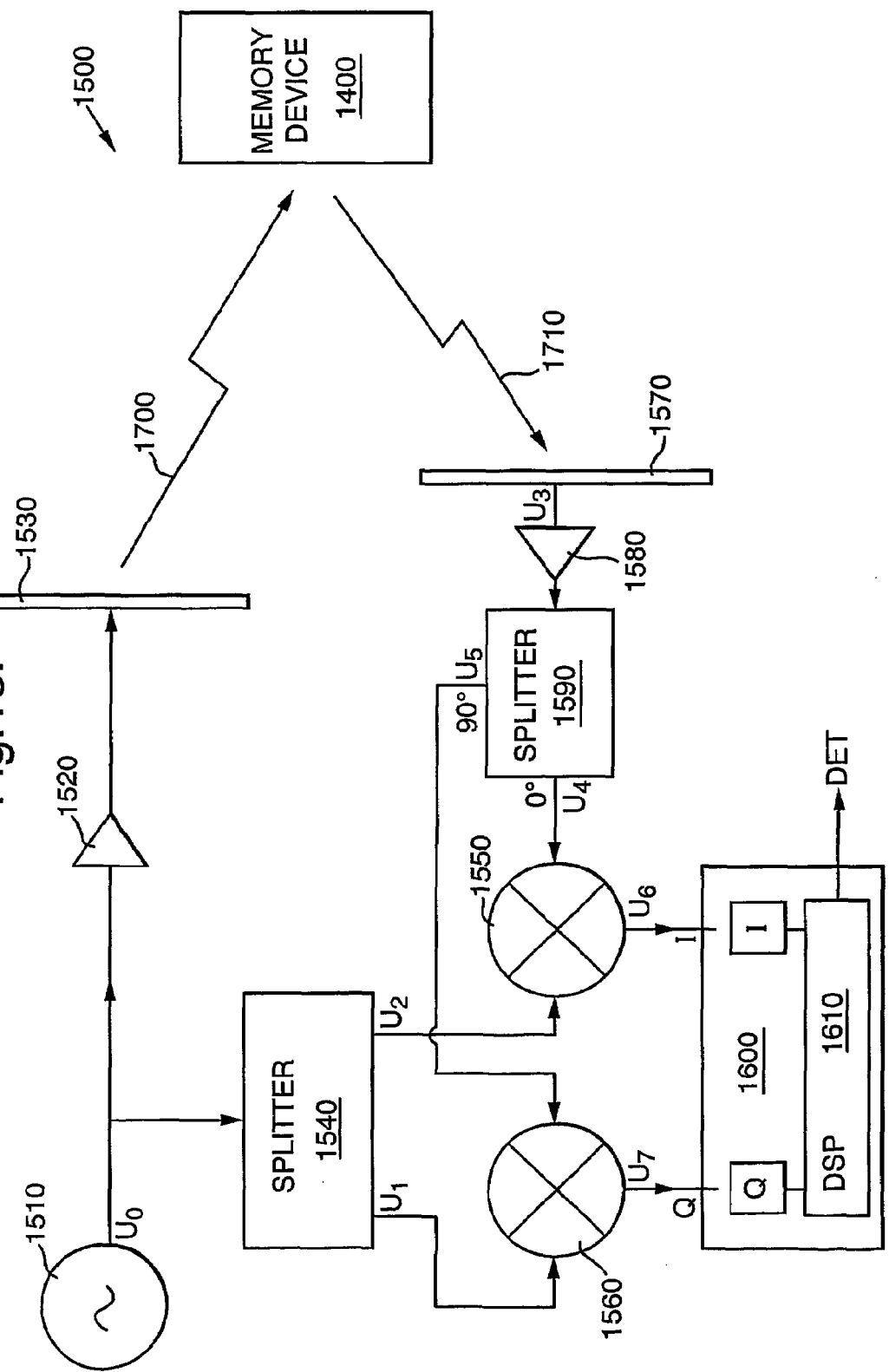
FIG. 13 is a schematic illustration of interrogating equipment for interrogating the device in FIG. 12.

The aforementioned interrogation equipment will now be further described with reference to FIG. 13. The interrogation equipment interrogating the device 1400 is indicated generally by 1500. The equipment 1500 comprises a reference signal generator 1510 for generating a reference signal at an output $U_0$ of the generator 1510. The output $U_0$ is connected via a power buffer amplifier 1520 to a transmitter patch antenna 1530, and also to a signal input of a first signal splitter 1540. The splitter 1540 includes two outputs $U_1$, $U_2$; in operation, the signal input to the splitter 1540 is equally coupled to the outputs $U_1$, $U_2$, the coupled signals at the outputs being mutually in phase. The outputs $U_1$, $U_2$ are coupled to first inputs of mixers 1550, 1560 respectively.

The equipment 1500 also includes a receiver patch antenna 1570 whose output is connected via a radio frequency amplifier 1580 to an input of a second splitter 1590. The second splitter 1590 is implemented as a directional coupler or, alternatively, as a branch coupler, in operation, it receives an input signal from the amplifier 1580 and couples the received signals substantially equally to its two outputs $U_4$, $U_5$. A portion of the received signal coupled to the output $U_5$ is phase shifted by 90°, namely by $\pi/2$ radians, relative to a portion of the received signal coupled to the output $U_4$. The outputs $U_4$, $U_5$ are connected to second inputs of the of the mixers 1550, 1560 respectively. Mixer outputs $U_6$, $U_7$ of the mixers 1550, 1560 are coupled to inputs I, Q respectively of a processing unit 1600. The processing unit 1600 includes a digital signal processor (DSP) 1610 for receiving signals input at the inputs I, Q and operable to measure temporal changes in their relative phase and relative amplitude corresponding to temporally encoded reflectivity exhibited by the modified device 1440 and to cross-correlate such temporally encoded reflectivity with code templates recorded in the processing unit 1600. The processing unit 1600 further comprises an output DET indicative of whether or not the modified device 1400 is recognised by the equipment 1500.

Operation of the equipment 1500 in combination with the modified device 1400 will now be described with reference to FIGS. 12 and 13. The signal generator 1510 generates a reference signal which passes to the buffer amplifier 1520 and is amplified therein to provide an amplified reference signal at an output of the amplifier 1520. The amplified signal propagates to the transmitter patch antenna 1530 wherefrom it is emitted as corresponding radiation 1700. The radiation 1700 propagates to the modified device 1400 and is received at its patch antenna 1420 whereat it gives rise to a received signal. The received signal passes to the rectification unit 1430 which rectifies the received signal to generate a corresponding d.c. potential for energising the memory unit 1440. In a similar manner to the aforementioned memory device 10, the memory unit 1440 imposes a temporally encoded fluctuating electrical load to the rectification unit 1430 which in turn temporally modulates impedance matching of the rectification unit 1430 to the antenna 1420. As a consequence, a portion 1710 of the radiation 1700 is reflected from the antenna 1420 in modulated encoded form to the receiver antenna 1570. The antenna 1570 receives the portion 1710 of the radiation 1700 and generates a corresponding received signal at the terminal $U_3$ which propagates to the amplifier 1580 which amplifies it to provide an amplified signal which passes to the input of the splitter 1590. The splitter 1590 outputs substantially half of the amplified signal to the output $U_4$ without phase shifting it, and also outputs substantially half of the amplified signal to the output $U_5$ phase shifted by 90°, namely in quadrature relative to the signal output at the output $U_4$. The $U_4$, $U_5$ output signals pass to the mixers 1550, 1560 respectively whereat the signals are heterodyned to baseband to corresponding I, Q signals which pass to the inputs I, Q of the processing unit 1600.

The DSP 1610 receives the I, Q signals input at the inputs I, Q and measures temporal changes in their relative phase and relative amplitude corresponding to temporally encoded reflectivity exhibited by the modified device 1440. The DSP 1610 then cross-correlates the temporal changes with code templates recorded in the processing unit 1600. If a correlation is identified by the DSP 1610, the DSP 1610 outputs at its DET output a code indicative of a modified device 1440 and its identification code. Otherwise, if no correlation is identified, the DSP 1610 outputs a non-recognition indicative code.

In the modified device 1400, it is desirable that the identification code applied by the memory unit 1440 has a clocking rate which is at least an order of magnitude greater than Doppler frequency shifts arising from the modified tag 1400 moving relative to the equipment 1500, otherwise accurate recognition of codes becomes difficult to execute reliably in the equipment 1500. Preferably, the memory unit 1440 operates to output its associated code at a clocking rate of at least a few kilohertz, for example 50 kHz; such a relatively high clocking rate is advantageous because sequentially triggered switches in the memory unit 1440 need then only exhibit relatively short associated time constants of a few microseconds.

In a situation where there are present the equipment 1500 and several devices each similar to the modified device 1400, there arises a potential problem of contention where several of the devices are triggered simultaneously by the equipment 1500 and the devices simultaneously reflect encoded radiation back to the equipment 1500. In order to address such contention, the devices can be further modified with regard to their associated rectification and memory units 1430, 1440 respectively. The rectification unit 1430 in the modified device 1440 then assumes a form similar to the rectification unit 910 providing V−, V+ and D+ outputs as illustrated in FIG. 8. Moreover, the memory unit 1440 is also modified into the form of a memory unit indicated by 1800 and illustrated in FIG. 14.

The memory unit 1800 comprises a cascaded series of switches indicated by 1810 and included within a dashed line 1820. Although three switches 1830, 1840, 1850 are shown, the series 1810 can include two or more switches depending upon the complexity of signature code desired. The unit 1800 further comprises a Schmitt inverting gate 1860, an exclusive-OR gate 1870, resistors $R_{20}$, $R_{21}$, $R_{22}$, capacitors $C_{20}$, $C_{21}$, $C_{22}$ and two gating switches 1880, 1890. Each of the switches 1830, 1840, 1850 is similar to each of the switches 210 in FIG. 2, or each of the switches illustrated in FIGS. 4 to 7, 9 to 11; each of the switches exhibits an associated switching time delay as described above which contributes to define a signature code for the device 1400.

Figure 14:
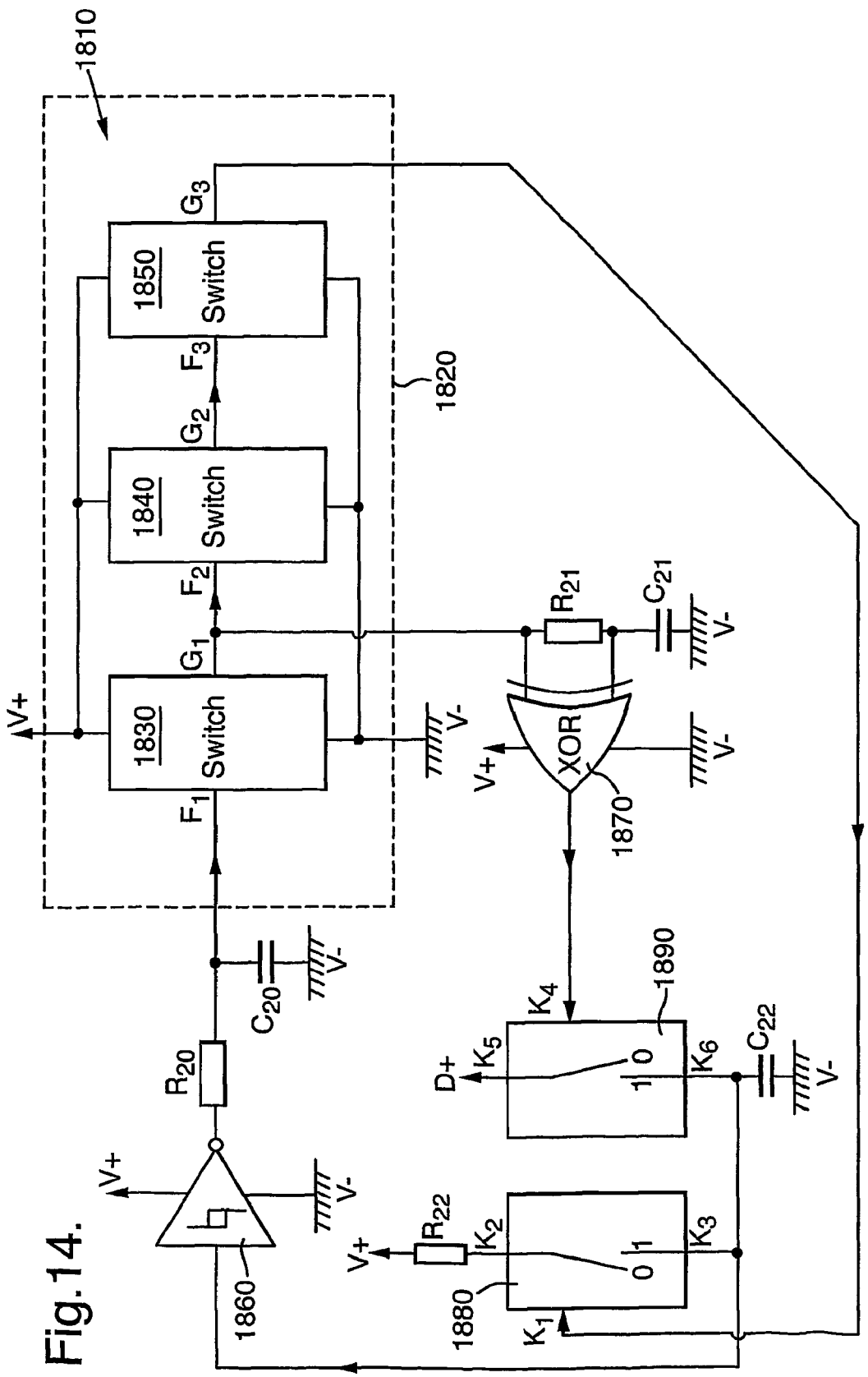
FIG. 14 is a circuit diagram of a memory unit of the memory device in FIG. 12, the memory unit adapted for coping with multiple device contention.

Interconnection of parts within the memory unit 1800 will now be described with reference to FIG. 14. The switch 1830 is the first switch in the series 1810, the switch 1830 including an input $F_1$ connected to a first end of the resistor $R_{20}$ and also to a first end of the capacitor $C_{20}$. A second end of the capacitor $C_{20}$ is coupled to a signal earth, and a second end of the resistor $R_{20}$ is connected to an output of the Schmitt gate 1860; the signal earth is connected to the output V− of the modified rectification unit 1430. The switch 1830 further includes an output $G_1$ which is connected to an input $F_2$ of the switch 1840 and additionally to a first input of the exclusive-OR gate 1870 and to a first end of the resistor $R_{21}$. A second end of the resistor $R_{21}$ is coupled to a second input of the exclusive-OR gate 1870 and to a first end of the capacitor $C_{21}$, the capacitor $C_{21}$ having a second end which is connected to the signal earth. An output $G_2$ of the switch 1840 is coupled to an input $F_3$ of the switch 1850.

An output $G_3$ of the switch 1850 is connected to a control input $K_1$ of the switch 1880. The input $K_1$ is operable to control connection between terminals $K_2$ and $K_3$ of the switch 1880; the terminals $K_2$, $K_3$ are mutually isolated through the switch 1880 when the input $K_1$ is in a logic 0 state, and conversely the terminals $K_2$, $K_3$ are mutually connected through the switch 1880 when the input $K_1$ is in a logic 1 state. The terminal $K_2$ is connected through the resistor $R_{22}$ to the V+ output of the modified rectification unit 1430. The terminal $K_3$ is coupled to a terminal $K_6$ of the switch 1890, to a first end of the capacitor $C_{22}$ and to an input of the inverting gate 1860; a second end of the capacitor $C_{22}$ is connected to the signal earth. A terminal $K_5$ is connected to the D+ output of the modified rectification unit 1430. Moreover, an output of the exclusive-OR gate 1870 is connected to a control input $K_4$ of the switch 1890. The input $K_4$ is operable to control connection between terminals $K_5$ and $K_6$ of the switch 1880; the terminals $K_2$, $K_3$ are mutually isolated through the switch 1880 when the input $K_4$ is in a logic 0 state, and conversely the terminals $K_5$, $K_6$ are mutually connected through the switch 1880 when the input $K_4$ is in a logic 1 state.

The output of the exclusive-OR gate 1870 is at a logic 1 state when either of its inputs are set to logic 1, and is at a logic 0 state when its inputs are both set to a logic 0 state, or alternatively both set to a logic 1 state.

Operation of the memory unit 1800 in combination with the modified version of the rectification unit 1430 and the antenna 1420 will now be described. The equipment 1500 emits the interrogating radiation 1700 which is received at the antenna 1420 and generates a corresponding received signal there. The received signal passes to the modified version of the rectification unit 1430 and causes a potential difference to develop between the D+, V+ outputs relative to the V− output. The potential difference then activates the memory unit 1800. The capacitors $C_{20}$, $C_{21}$, $C_{22}$ are initially in a discharged state resulting in the output of the gate 1860 being in a logic 1 state; the gate 1860 thereby, through the resistor $R_{20}$ and the capacitor $C_{20}$, triggers the series of switches 1810 to output their code which modulates load on the output V+ and hence modulates radiation reflectivity characteristics of the antenna 1420. Triggering the switch 1830 causes the exclusive-OR gate 1870 to connect the D+ output to the capacitor $C_{22}$ causing it to charge up towards a logic 1 state. When the series 1810 is triggered through to the last switch 1856, the output $G_3$ switches to a logic 1 state which connects the V+ output via the resistor $R_{22}$ to the capacitor $C_{22}$ causing the capacitor $C_{22}$ to further charge towards a logic 1 state. The capacitor $C_{22}$ charges to the logic 1 state causing the output of the gate 1860 to assume a logic 0 state and thereby prevent repetitive triggering of the series 1810. When a potential difference falls again to a value resulting in the output of the gate 1860 switching to a logic 1 state, the series 1810 is then retriggered. Inclusion of the switch 1890 enables a potential instantaneously generated at the D+ output to charge the capacitor $C_{22}$ and thereby inhibit repetitive triggering of the series 1810; the potential at the D+ output is generated if there are other devices already responding to the interrogating radiation 1700. Thus, the circuit 1800 represents a simple approach to resolving contention between a number of devices of the invention being interrogated simultaneously.

It will be appreciated that modifications can be made to the devices 10, 900, 1400 and the circuits 200, 500, 600, 700, 800, 940, 1100 without departing from the scope of the invention.

For example, the capacitors in the circuits 200, 500, 600, 700, 800, 940, 1100 can incorporate liquid crystal material as a dielectric therein. The liquid crystal material can be made accessible to laser irradiation for changing its state, for example from an isotropic state to a monotropic state thereby changing the material's dielectric constant depending upon its state. Thus, use of liquid crystal material enables the circuits to have data programmed therein by selective laser irradiation. If the liquid crystal material is bistatic, the circuits can be made re-writeable so that data stored in the devices can be updated periodically. Moreover, each stage of the circuits 200, 500, 600, 700, 800, 940 can be made to function as a local oscillator, for example by including local regenerative feedback therearound, so that each stage oscillates briefly when triggered until its succeeding stage is triggered. Such a modification has the advantage that the apparatus 20 senses from devices 10, 900 as a sequence of bursts of oscillation at a number of differing frequencies as stages of the devices 10, 900 are successively triggered. The apparatus 20 can thereby demodulate information conveyed from the devices using frequency demodulation techniques.

Furthermore, the circuits 200, 500, 600, 700, 800, 940 can be provided with current sources at each stage for linearly charging associated propagation delay determining capacitors in the stages. As a consequence, current pulses extracted from the line V+ in operation will be substantially linearly decaying with time in contrast to exponentially decaying current pulses as in the aforementioned circuits. Use of current sources provides the further advantage that durations of the pulses will be less influenced by the magnitude of the potential difference generated between the lines V−, V+ when the devices 10, 900 are in operation.

The invention claimed is:

1. A memory device operable to receive an input signal and to generate in response a corresponding output signal bearing data, the device comprising:
a series of circuit stages operable to be triggered by the input signal at a first stage of the series, thereby causing a sequential triggering of the stages along the series to a last stage of the series to generate the output signal, the data represented in time durations taken for each stage in the series to trigger a subsequent stage in the series.

2. The device according to claim 1, wherein the stages are configured such that each stage incorporates an input connected to a preceding stage in the series, and an output connected to a successive stage in the series, each stage being operable to exhibit an associated signal propagation delay therethrough from its input to its output, the propagation delays of the stages being configured to represent the data.

3. The device according to claim 1, wherein the series of stages is configured to sequentially trigger at a rate at least an order of magnitude greater than Doppler frequency shifts resulting from relative motion of the device when the output signal is received from the device.

4. The device according to claim 2, wherein a stage incorporates a resistor and a capacitor for determining its propagation delay.

5. The device according to claim 2, wherein a stage incorporates a capacitor and a current source for determining its propagation delay, the current source being operable to substantially linearly charge its associated capacitor when the stage is triggered.

6. The device according to claim 4, wherein the capacitor includes liquid crystal material as a dielectric for the capacitor, the material being optically modifiable for setting the propagation delay of its associated stage.

7. The device according to claim 1, wherein the series of stages further includes a feedback path therearound linking the last stage to the first stage, the feedback path being operable to cause the series to repetitively output its data during a period when the input signal is applied to the series.

8. The device according to claim 7, further comprising control circuitry configured to interrupt repetition of the data in response to the input signal received.

9. The device according to claim 1, wherein a stage is operable to switch its respective output between binary states.

10. The device according to claim 9, wherein the stage is operable to exhibit a Schmitt-trigger characteristic from its input to its output.

11. The device according to claim 1, further comprising coupling circuitry configured to receive input radiation and generate the input signal in response, and to receive the output signal and emit output radiation from the coupling circuitry in response.

12. The device to claim 11, wherein the coupling circuitry comprises a magnetically coupled loop antenna configured to receive the input radiation and emit the output radiation.

13. The device according to claim 11, wherein the coupling circuitry comprises a patch antenna configured to receive the input radiation and emit the output radiation.

14. The device according to claim 11, further comprising converting circuitry configured to convert a portion of the input signal into an electrical signal for powering and triggering the stages, the stages being operable to present a variable load to the electrical signal, thereby modulating a portion of the input radiation reflected from the coupling circuitry, the portion of the input radiation corresponding to the output radiation.

15. The device according to claim 14, wherein the converting circuitry comprises a rectifier configured to rectify part of the input radiation to generate a unipolar signal, and a charge storage configured to filter the unipolar signal to generate the electrical signal.

16. The device according to claim 1, wherein the stages incorporate field effect transistors, the stages being coupled together by sharing a single field effect transistor drain-source channel extending along the series.

17. The device according to claim 2, wherein a stage incorporates a piezoelectric bimorph switching structure operable to deflect in response to a signal at the input of the stage and thereby generate a signal at the output of the stage for triggering a subsequent stage of the series.

18. The device according to claim 5, wherein the capacitor includes liquid crystal material as a dielectric for the capacitor, the material being optically modifiable for setting the propagation delay of its associated stage.

19. The device according to claim 11, wherein the coupling circuitry comprises a folded dipole antenna configured to receive the input radiation and emit the output radiation.

20. A memory device operable to receive an input signal and generate an output signal bearing data, the device comprising:
a first circuit stage configured to receive an input signal and produce a first stage output signal; and
a second circuit stage configured to receive the first stage output signal and produce a second stage output signal,
wherein the first circuit stage is triggered to produce the first stage output signal after it receives the input signal, and the second circuit stage is triggered to produce the second stage output signal after it receives the first stage output signal, and
wherein the sequential triggering of the first and second stages generates a data output, the data represented in time durations taken for each of the first and second stages to produce the first and second stage output signals, respectively.

21. The device according to claim 20, further comprising:
a third circuit stage configured to receive the second stage output signal and produce a third stage output signal,
wherein the third circuit stage is triggered to produce the third stage output signal after it receives the second stage output signal, and
wherein the sequential triggering of the first, second, and third stages generates a data output, the data represented in time durations taken for each of the first, second, and third stages to produce the first, second, and third stage output signals, respectively.

22. The device according to claim 20, further comprising:
one or more additional subsequent circuit stages in a series configured to receive a stage output signal from a preceding stage and produce a stage output signal for a successive stage, the first of the additional subsequent stages being configured to receive the second stage output signal,
wherein each of the additional subsequent stages is triggered to produce the stage output signal for a successive stage after the stage receives the stage output signal from a preceding stage, and
wherein the sequential triggering of the stages generates a data output, the data represented in time durations taken for each of stages to produce the respective stage output signal.

23. The device according to claim 22, wherein the series of stages is configured to sequentially trigger at a rate at least an order of magnitude greater than Doppler frequency shifts resulting from relative motion of the device when the data output is received from the device.

24. A memory device operable to receive an input signal and generate an output signal bearing data, the device comprising:
circuit stages configured in a series, wherein a first circuit stage in the series is configured to produce an output to a second circuit stage after the first circuit stage receives the input signal,
wherein commencing with the second circuit stage in the series, each circuit stage incorporates an input connected to an output of a preceding stage in the series, each circuit stage in the series being configured to produce an output signal at its output after receiving a signal at its input, and
wherein each circuit stage is operable to exhibit a signal propagation delay therethrough from its input to its output, the propagation delays of the stages being configured to represent the data, in the output signal bearing data.

25. The device according to claim 24, wherein a circuit stage incorporates a resistor and a capacitor for determining its propagation delay.

26. The device according to claim 25, wherein the capacitor includes liquid crystal material as a dielectric for the capacitor, the material being optically modifiable for setting the propagation delay of its associated circuit stage.

27. The device according to claim 24, wherein a circuit stage incorporates a capacitor and a current source for determining its propagation delay, the current source being operable to substantially linearly charge its associated capacitor when an output of a preceding circuit stage is received.

28. The device according to claim 27, wherein the capacitor includes liquid crystal material as a dielectric for the capacitor, the material being optically modifiable for setting the propagation delay of its associated stage.

29. The device according to claim 24, wherein a circuit stage incorporates a piezoelectric bimorph switching structure operable to deflect in response to a signal at the input of the circuit stage and thereby generate a signal at the output of the circuit stage.

30. The device according to claim 24, further comprising a feedback path linking the output of a last circuit stage to the first circuit stage, the feedback path being operable to cause the circuit stages to repetitively produce the data output during a period when the input signal is received by the first circuit stage.

31. The device according to claim 30, further comprising control circuitry configured to interrupt repetition of the data output in response to the input signal received.

32. The device according to claim 24, further comprising coupling circuitry configured to receive input radiation and generate the input signal in response, and to receive the data output and emit output radiation from the coupling circuitry in response.

33. The device according to claim 32, further comprising converting circuitry configured to convert a portion of the input signal into an electrical signal for powering and providing input to the circuit stages, the circuit stages being operable to present a variable load to the electrical signal, thereby modulating a portion of the input radiation that is reflected from the coupling circuitry, the portion of the input radiation corresponding to the output radiation.

34. The device according to claim 33, wherein the converting circuitry comprises a rectifier configured to rectify part of the input radiation to generate a unipolar signal, and a charge storage configured to filter the unipolar signal to generate the electrical signal.

35. The device according to claim 22, wherein the circuit stages incorporate field effect transistors, the circuit stages being coupled together by sharing a single field effect transistor drain-source channel extending along the circuit stages.

36. The device according to claim 8, wherein the control circuitry includes a pulse generator configured to cause a switch to couple an electrical signal to the feedback path to affect the charging of a capacitor on the feedback path capable of triggering the first stage of the series of stages.

37. The device according to claim 17, wherein the piezoelectric bimorph switching structure includes a first and second conductive track on an upper surface and a third conductive track on a lower surface, wherein the switching structure is operable to deflect based on a potential between the second and third track, thereby causing the first track to make an electrical contact that causes a subsequent stage in the series to be triggered.

38. The device according to claim 1, wherein the stages are operable to present a variable load to an electrical signal as each stage is triggered and thereby generate the output signal bearing data.

39. The device according to claim 20, wherein the circuit stages are operable to present a variable load to an electrical signal as each circuit stage is triggered and thereby generate the output signal bearing data.

40. The device according to claim 20, wherein a circuit stage incorporates a resistor and a capacitor for determining the time duration taken to produce its circuit stage output signal.

41. The device according to claim 20, wherein a circuit stage incorporates a capacitor and a current source for determining the time duration taken to produce its circuit stage output signal, the current source being operable to substantially linearly charge its associated capacitor when the circuit stage is triggered.

42. The device according to claim 22, wherein the series of circuit stages further includes a feedback path therearound linking the last stage to the first stage, the feedback path being operable to cause the series to repetitively output its data during a period when the input signal is applied to the series.

43. The device according to claim 42, further comprising control circuitry configured to interrupt repetition of the data in response to the input signal received.

44. The device according to claim 43, wherein the control circuitry includes a pulse generator configured to cause a switch to couple an electrical signal to the feedback path to affect the charging of a capacitor on the feedback path capable of triggering the first stage of the series of circuit stages.

45. The device according to claim 20, wherein a circuit stage is operable to switch its respective output between binary states.

46. The device according to claim 45, wherein the circuit stage is operable to exhibit a Schmitt-trigger characteristic from its input to its output.

47. The device according to claim 20, wherein a circuit stage incorporates a piezoelectric bimorph switching structure operable to deflect in response to a signal at the input of the stage and thereby generate a signal at the output of the stage.

48. The device according to claim 47, wherein the piezoelectric bimorph switching structure includes a first and second conductive track on an upper surface and a third conductive track on a lower surface, wherein the switching structure is operable to deflect based on a potential between the second and third track, thereby causing the first track to make an electrical contact that causes a subsequent stage in the series to be triggered.

49. The device according to claim 24, wherein the circuit stages are configured to sequentially produce an output to a subsequent stage at a rate at least an order of magnitude greater than Doppler frequency shifts resulting from relative motion of the device when the output signal bearing data is received from the device.

50. The device according to claim 24, wherein a circuit stage is operable to switch its respective output between binary states.

51. The device according to claim 50, wherein the circuit stage is operable to exhibit a Schmitt-trigger characteristic from its input to its output.

52. The device according to claim 24, wherein the circuit stages incorporate field effect transistors, the stages being coupled together by sharing a single field effect transistor drain-source channel extending along the series of stages.

53. The device according to claim 24, wherein the circuit stages are operable to present a variable load to an electrical signal as each circuit stage is caused to produce an output signal to a subsequent stage and thereby generate the output signal bearing data.

54. The device according to claim 29, wherein the piezoelectric bimorph switching structure includes a first and second conductive track on an upper surface and a third conductive track on a lower surface, wherein the switching structure is operable to deflect based on a potential between the second and third track, thereby causing the first track to make an electrical contact that causes the signal to be generated at the output of the stage.

55. The device according to claim 31, wherein the control circuitry includes a pulse generator configured to cause a switch to couple an electrical signal to the feedback path to affect the charging of a capacitor on the feedback path capable of causing the first circuit stage to produce an output to the second circuit stage.

* * * * *

UNITED STATES PATENT AND TRADEMARK OFFICE
CERTIFICATE OF CORRECTION

PATENT NO.        : 7,234,642 B2
APPLICATION NO.   : 10/296769
DATED             : June 26, 2007
INVENTOR(S)       : I. J. Forster It is certified that error appears in the above-identified patent and that said Letters Patent is hereby corrected as shown below:

| COLUMN | LINE | ERROR |
|---|---|---|
| 2 | 2 | "thereof" should read --thereof.-- |
| 3 | 42 | "circuit for the" should read --circuit for-- |
| 6 | 5 | "thereby capable" should read --thereby are capable-- |
| 6 | 26 | "230a The" should read --230a. The-- |
| 6 | 54 | "manner as" should read --manner to that-- |
| 8 | 2 | "The gates" should read --The gate-- |
| 8 | 26-27 | "shown in FIG." should not break or be indented |
| 9 | 65 | "manner as" should read --manner to that-- |
| 10 | 18 | "Cd1," should read --C1,-- |
| 11 | 7 | "FIG." should read --FIGS.-- |
| 11 | 28 | "aresistor" should read --a resistor-- |
| 12 | 20 | "eventual" should read --eventually-- |
| 12 | 67 | "that that" should read --that-- |

Signed and Sealed this
Seventh Day of August, 2012

David J. Kappos
*Director of the United States Patent and Trademark Office*

CERTIFICATE OF CORRECTION (continued)
U.S. Pat. No. 7,234,642 B2

| COLUMN | LINE | ERROR |
|---|---|---|
| 13 | 22 | "responding" should read --responds-- |
| 13 | 49 | "branch coupler," should read --branch coupler;-- |
| 13 | 55-56 | delete the second occurrence of "of the" |
| 17 (Claim 12, line 1) | 57 | "The device to" should read --The device according to-- |
| 19 (Claim 24, line 17) | 22 | "data," should read --data-- |